(12) United States Patent
Akiyama et al.

(10) Patent No.: US 6,414,729 B1
(45) Date of Patent: Jul. 2, 2002

(54) LIQUID CRYSTAL DISPLAY DEVICE HAVING STOCKED PIXEL LAYERS

(75) Inventors: Masahiko Akiyama, Tokyo; Yuko Kizu, Kanagawa-ken, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/273,277

(22) Filed: Mar. 22, 1999

(30) Foreign Application Priority Data

Mar. 20, 1998 (JP) .......................................... 10-071606

(51) Int. Cl.[7] .............................................. G02F 1/1343
(52) U.S. Cl. ........................... 349/38; 349/141; 349/147
(58) Field of Search ............................... 349/74–83, 38, 349/84, 141, 143, 147, 144, 110

(56) References Cited

U.S. PATENT DOCUMENTS 5,625,474 A * 4/1997 Aomori et al. ............... 349/79
5,712,695 A * 1/1998 Tanaka et al. ................ 349/79
5,790,215 A * 8/1998 Sugahara et al. ............. 349/74
5,986,729 A * 11/1999 Yamanaka et al. ........... 349/79
6,067,134 A * 5/2000 Akiyama et al. ............. 349/74

FOREIGN PATENT DOCUMENTS

JP           9-80488     *  3/1997

* cited by examiner

Primary Examiner—William L. Sikes
Assistant Examiner—Mike Qi
(74) Attorney, Agent, or Firm—Oblon, Spivak, McClelland, Maier & Neustadt, P.C.

(57) ABSTRACT

A liquid crystal display device including a plurality of pixel electrodes and a plurality of liquid crystal layers stacked alternately. A shield electrode is disposed below the lowest pixel electrode. Potential differences are applied to liquid crystal layers other than the uppermost liquid crystal layer by supplying potentials to the respective pixel electrodes. Thereafter, the pixel electrodes other than the uppermost pixel electrode are rendered in a floating state, and a prescribed potential difference is applied to the uppermost liquid crystal layer by supplying a proper potential to the uppermost pixel electrode. A potential corresponding to the potential that is supplied to the uppermost pixel electrode is applied to the shield electrode.

17 Claims, 29 Drawing Sheets

LIQUID CRYSTAL DISPLAY DEVICE HAVING STOCKED PIXEL LAYERS

CROSS-REFERENCE TO RELATED APPLICATION

This application claims priority from Japanese Application No. 10-071606 filed Mar. 20, 1998, the entire content of which is hereby incorporated by reference.

BACKGROUND OF THE INVENTION

1. Field of the Invention

The present invention relates to a liquid crystal display device and, in particular, to a stack-type liquid crystal display device having stacked liquid crystal layers.

2. Discussion of the Background

Being thin and of low power consumption, liquid crystal display devices are now widely used in notebook-sized personal computers. In particular, the low power consumption is a feature that makes liquid crystal display devices superior to other displays such as CRT displays and plasma displays. Liquid crystal display devices are expected to be increasingly widely applied to personal information equipment in the future.

In portable equipment, it is desirable that the power consumption of the display be 500 mW or less, preferably as low as several milliwatts. Consequently, the reflection-type liquid crystal display device is desirable because it does not require a backlight and is of low power consumption. Among reflection-type color liquid crystal display devices are the in-plane type devices using color filters. However, if the color purity in these devices is improved, the light utilization efficiency is lowered by a factor of three or more, and hence the reflectance is decreased.

In view of the above, stack/reflection-type liquid crystal display devices having stacked liquid crystal layers have been proposed (refer to Japanese Unexamined Patent Publication No. Hei. 8-313939, for example). In the reflection-type liquid crystal display device disclosed in the publication No. Hei. 8-313939, guest-host liquid crystal layers of cyan, magenta, and yellow are used. To apply potential differences to the respective liquid crystal layers, pixel electrodes are provided so that each liquid crystal layer is interposed in between and an active matrix substrate is provided under each liquid crystal layer. The pixel electrodes are connected to respective active elements such as TFTs via columnar electrodes. A desired display image is produced by applying prescribed potential differences to the respective liquid crystal layers in the form of potential differences between the pixel electrodes. Although this type of stack-type liquid crystal display device enables high light utilization efficiency and hence can provide a bright reflection image, it requires the application of differential potential differences to the respective liquid crystal layers in the driving of the pixels.

Japanese Unexamined Patent Publication No. Hei. 9-80488 has proposed one method of applying differential potential differences, in which differential potential differences are generated in a pixel by driving pixel layers (sub-pixels) in a time-divisional manner (time-divisional differential driving) and rendering the other pixel layers in a floating state when a potential difference is applied to one pixel layer. However, the potentials of pixel electrodes that are rendered in a floating state tend to vary due to coupling with scanning lines, signal lines, or the like, possibly resulting in deterioration in image quality such as crosstalk.

Further, as for the use of auxiliary capacitors in the time-divisional differential driving, sufficient studies have not been made of how to connect and arrange the auxiliary capacitors to effectively reduce the degree of coupling with scanning lines and signal lines.

As described above, in conventional liquid crystal display devices that display by applying prescribed potential differences to the respective stacked pixel layers (sub-pixels) in a time-divisional manner, effective measures have not been taken in terms of the driving technique, the layout of auxiliary capacitors. and other techniques in order to reduce the degree of coupling with scanning lines and signal lines that are provided on the lower-layer side.

SUMMARY OF THE INVENTION

The present invention has been made in view of the above problems in the art. Therefore, in a liquid crystal display device that displays by applying prescribed potential differences to respective stacked pixel layers in a time-divisional manner, an object of the present invention is to reduce the degree of coupling with scanning lines and signal lines provided on the lower-layer side. In other words, an object of the present invention is to shield the liquid crystal layers from scanning and signal lines.

A liquid crystal display device according to the present invention comprises a plurality of pixel electrodes and a plurality of liquid crystal layers that are stacked alternately, a shield electrode that is disposed below the lowest pixel electrode, and a circuit for supplying the shield electrode with a potential corresponding to a potential that is supplied to the uppermost pixel electrode.

The uppermost and lowest pixel electrodes are the uppermost and lowest ones of the stacked pixel electrodes that function substantially to apply prescribed potential differences to the respective liquid crystal layers.

The circuit for supplying the shield electrode with a potential corresponding to a potential that is supplied to the uppermost pixel electrode may short circuit the shield electrode to the uppermost pixel electrode.

In the liquid crystal display device of the present invention, after prescribed potentials have been applied to the respective liquid crystal layers other than the uppermost liquid crystal layer by supplying potentials to the respective pixel electrodes, the pixel electrodes that have served to apply the prescribed potential differences are rendered in a floating state, and prescribed potentials are applied to the uppermost pixel electrode and the shield electrode.

It is preferable to provide a common electrode in such a manner that the uppermost liquid crystal layer is interposed between the uppermost pixel electrode and the common electrode (the uppermost liquid crystal layer is disposed above the uppermost pixel electrode). In this case, a prescribed potential difference may be applied to the uppermost liquid crystal layer by supplying prescribed potentials to the uppermost pixel electrode and the common electrode.

In the above liquid crystal display device, after potential differences corresponding to display signals have been applied to the liquid crystal layers other than the uppermost liquid crystal layer, the liquid crystal layers other than the uppermost liquid crystal layer are rendered in a floating state and a potential difference corresponding to a display signal is applied to the uppermost liquid crystal layer. At this time, the potential of the shield electrode that is disposed below the lowest pixel electrode varies in link with the potential of the uppermost pixel electrode. Therefore, even if regions exist below the shield electrode that are given prescribed potentials such as signal lines, scanning lines, and active elements, potential variations at the pixel electrodes due to coupling with those regions can be inhibited. Further, the potential differences applied to the respective liquid crystal layers can be maintained.

Another aspect of the present invention provides a liquid crystal display device having a shield electrode that is disposed below the lowest pixel electrode in which after prescribed potentials have been applied to the respective liquid crystal layers other than the lowest liquid crystal layer, the pixel electrodes other than the lowest pixel electrode are rendered in a floating state, and a prescribed potential difference is applied to the lowest liquid crystal layer by supplying proper potentials to the lowest pixel electrode and the shield electrode. In this liquid crystal display device, after potential differences corresponding to display signals have been applied to the liquid crystal layers other than the lowest liquid crystal layer, the liquid crystal layers other than the lowest liquid crystal layer are rendered in a floating state and a potential difference corresponding to a display signal is applied to the lowest liquid crystal layer. At this time, the shield electrode that is disposed below the lowest pixel electrode has a prescribed potential. Therefore, even if regions exist below the shield electrode that are given prescribed potentials such as signal lines, scanning lines, and active elements, potential variations at the pixel electrodes due to coupling with those regions can be inhibited. Therefore, the potential differences applied to the respective liquid crystal layers can be maintained. It is preferable that the shield electrode be a common electrode of the lowest liquid crystal layer.

Another aspect of the present invention provides a liquid crystal display device comprising a plurality of pixel electrodes and a plurality of liquid crystal layers that are stacked alternately, and a plurality of electrodes for auxiliary capacitors that are disposed below the lowest liquid crystal layer. The auxiliary capacitor electrodes can be stacked in the order that is opposite to the stack order of the corresponding pixel electrodes.

The lowest pixel electrode and the uppermost auxiliary capacitor electrode may be commonized with each other; that is, a single electrode may be provided that has the functions of those two electrodes.

Still another aspect of the present invention provides a liquid crystal display device having auxiliary capacitor electrodes below the lowest liquid crystal layer in which after prescribed potentials have been applied to the respective liquid crystal layers other than the uppermost liquid crystal layer, the pixel electrodes other than the uppermost pixel electrode are rendered in a floating state, and proper potentials are applied to the uppermost pixel electrode and the corresponding auxiliary capacitor electrode.

It is preferable to provide a common electrode in such a manner that the uppermost liquid crystal layer is interposed between the uppermost pixel electrode and the common electrode (the uppermost liquid crystal layer is disposed above the uppermost pixel electrode). In this case, a prescribed potential difference may be applied to the uppermost liquid crystal layer by supplying prescribed potentials to the uppermost pixel electrode and the common electrode.

A further aspect of the present invention provides a liquid crystal display device having a plurality of auxiliary capacitor electrodes that are disposed below the lowest liquid crystal layer in which after prescribed potentials have been applied to the respective liquid crystal layers other than the lowest liquid crystal layer, the pixel electrodes other than the lowest pixel electrode are rendered in a floating state, and a prescribed potential difference is applied to the lowest liquid crystal layer by supplying proper potentials to the lowest pixel electrode and the corresponding auxiliary capacitor electrode.

It is preferable to provide a common electrode in such a manner that the lowest liquid crystal layer is interposed between the lowest pixel electrode and the common electrode (the lowest liquid crystal layer is disposed below the lowest pixel electrode). In this case, a prescribed potential difference may be applied to the lowest liquid crystal layer by supplying prescribed potentials to the lowest pixel electrode and the common electrode.

The auxiliary capacitor electrodes function as shields. Therefore, even if there exist, below the lowest auxiliary capacitor electrode, regions that are given prescribed potentials such as signal lines, scanning lines, and active elements, potential variations at the pixel electrodes due to coupling with those regions can be inhibited. Therefore, the potential differences applied to the respective liquid crystal layers can be maintained.

Since a lower pixel electrode is more influenced through coupling with underlying regions, a higher auxiliary capacitor electrode has a stronger shield effect for the pixel electrodes. If the auxiliary capacitor electrodes are stacked in the order that is opposite to the stack order of the corresponding pixel electrodes, the lowest pixel electrode that is influenced through the coupling most and the uppermost auxiliary capacitor electrode that has the strongest shield effect can be given the same potential. Therefore, the coupling can be minimized.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
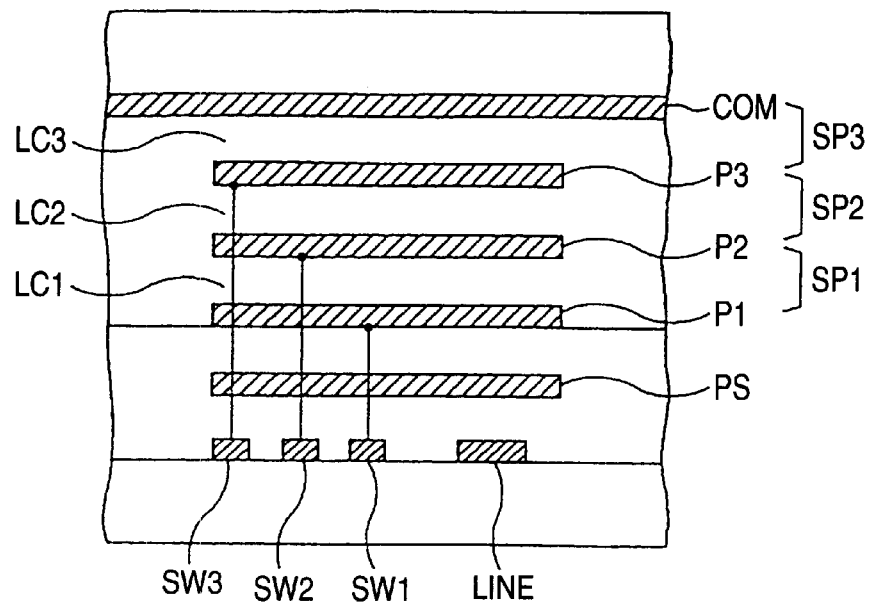
FIG. 1 shows a cross-sectional view of a display according to a first embodiment of the present invention.

Referring now to the drawings, wherein like reference numerals designate identical or corresponding parts throughout the several views, embodiments of the present invention are hereinafter described.

FIG. 1 shows a cross-sectional view of a liquid crystal display according to a first embodiment of the present invention.

Three liquid crystal layers LC1–LC3 corresponding to cyan, magenta, and yellow, respectively, are disposed one on another. Three sub-pixels SP1–SP3 are each interposed between three stacked pixel electrodes P1–P3 and an opposed electrode COM to form one pixel. A shield electrode PS is disposed under the lowest pixel electrode PI with an insulating layer interposed in between. The shield electrode PS functions as a shield against underlying switching elements (such as thin-film transistors) SW1–SW3 and a wiring line (interconnection) LINE. The switching elements SW1–SW3 are connected to the respective pixel electrodes P1–P3.

To drive the pixels, first, prescribed potential differences are applied to the respective sub-pixels SP1 and SP2 via the switching elements SW1–SW3. Then, a prescribed potential difference is applied to the sub-pixel SP3 that is located between the pixel electrode P3 and the opposed electrode COM in a state that the pixel electrodes PI and P2 are rendered in a floating state by turning off the switching elements SW1 and SW2. At this time, a potential is applied to the shield electrode PS substantially equal to a potential that is supplied to the pixel electrode P3. As a result, the potential differences that have been applied to the respective sub-pixels SP1 and SP2 are held as they are. That is, in this method, a potential difference is applied to the sub-pixel SP3 after applying potential differences to the sub-pixels SP1 and SP2.

There is another method in which potentials are applied to the three pixel electrodes P1–P3 at one time instead of performing two times of writing. However, in such a method, it is necessary to apply potentials to the pixel electrodes P1–P3 after determining, through a calculation, how to allocate potential differences between the potential of the opposed electrode COM and the ground potential. This method requires a peripheral operation circuit and hence is very disadvantageous in terms of manufacturing cost and power consumption.

In contrast, when writing is performed two times as in the present invention, no extra calculation is needed, because prescribed potential differences are given to the respective sub-pixels SP1 and SP2 to write signals thereby supplying potentials to the respective pixel electrodes P1 and P2. Then a potential difference is applied to the sub-pixel SP3 (i.e., between the pixel electrode P3 and the opposed electrode COM) by shifting the potentials of the pixel electrodes P1 and P2 while keeping the potential differences across the respective sub-pixels SP1 and SP2. Therefore, driving can be performed without providing a new peripheral operation circuit for the liquid crystal display section.

Figure 2:
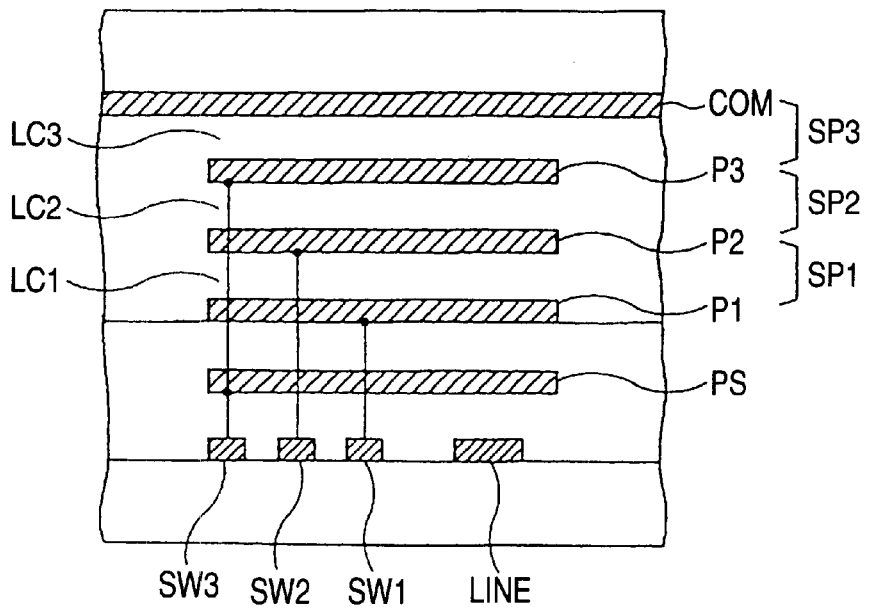
FIGS. 2–5 show cross-sectional views of a display according to modifications of the first embodiment of the present invention.
Figure 3:
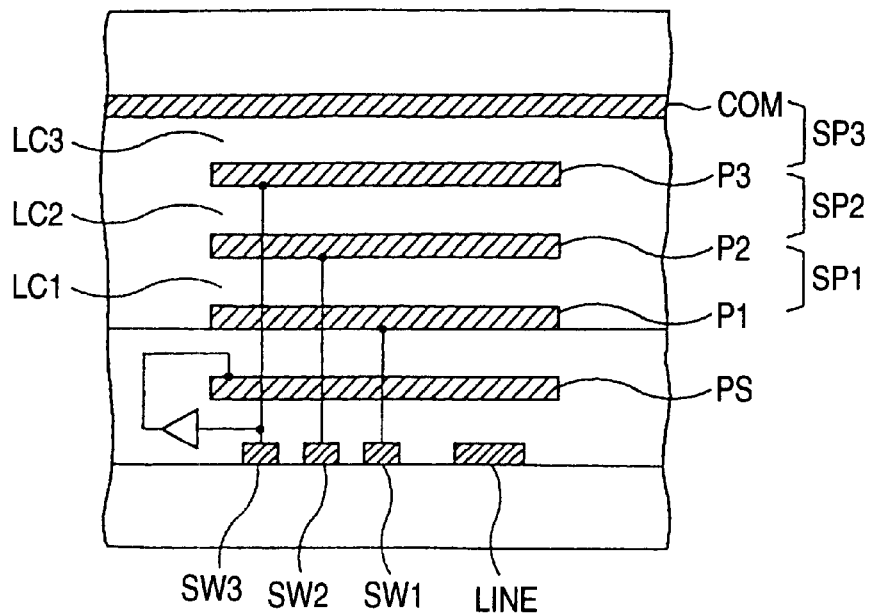
Figure 4:
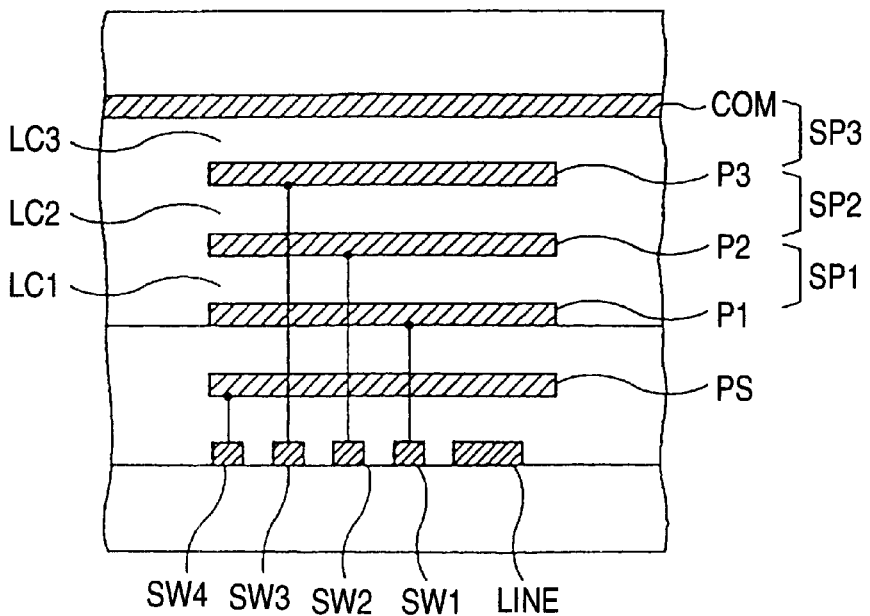
Figure 5:
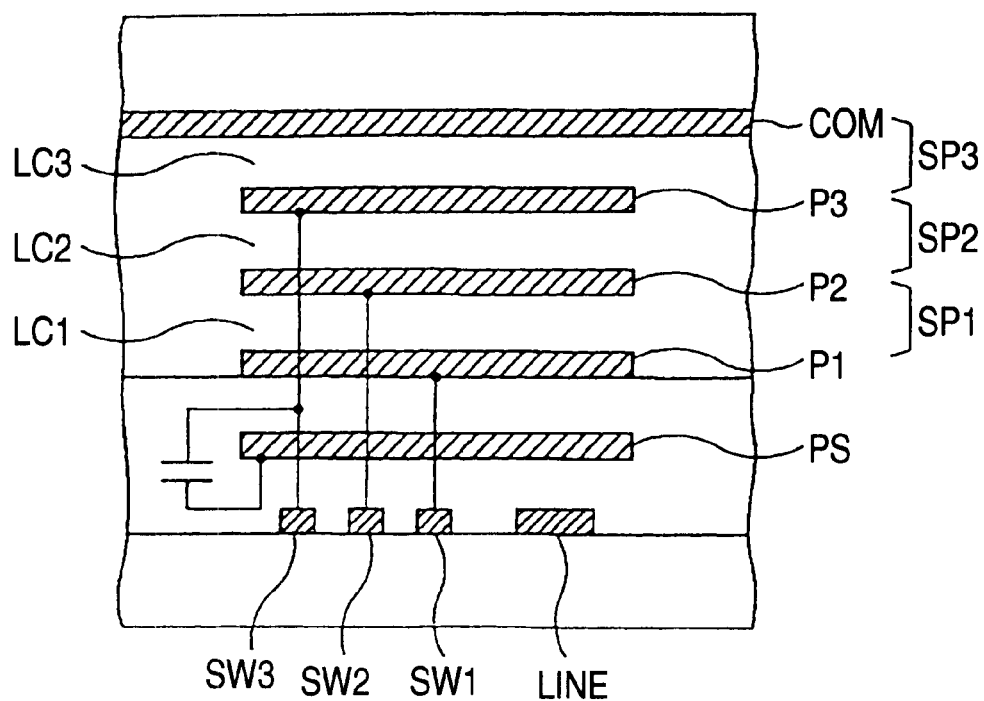

FIGS. 2–5 show cross-sectional views of a liquid crystal display in accordance with modifications of the first embodiment of the present invention. For example, methods for supplying the shield electrode PS with a potential corresponding to a potential supplied to the pixel electrode P3 are:

(1) short-circuiting the shield electrode PS and the pixel electrode P3 (see FIG. 2);

(2) supplying the shield electrode PS with the same potential as supplied to the pixel electrode P3 via an amplifier (buffer) (see FIG. 3);

(3) supplying the shield electrode PS with the same potential as supplied to the pixel electrode P3 from a separate switching element SW4 (see FIG. 4); and (4) supplying the shield electrode PS with the same potential as supplied to the pixel electrode P3 via another capacitance component, (for example, a capacitor having a sufficiently larger capacitance than the capacitance of each liquid crystal layer and each auxiliary capacitor) (see FIG. 5).

The method of FIG. 2 in which the shield electrode PS is short-circuited with the pixel electrode P3 is described below.

Figure 6:
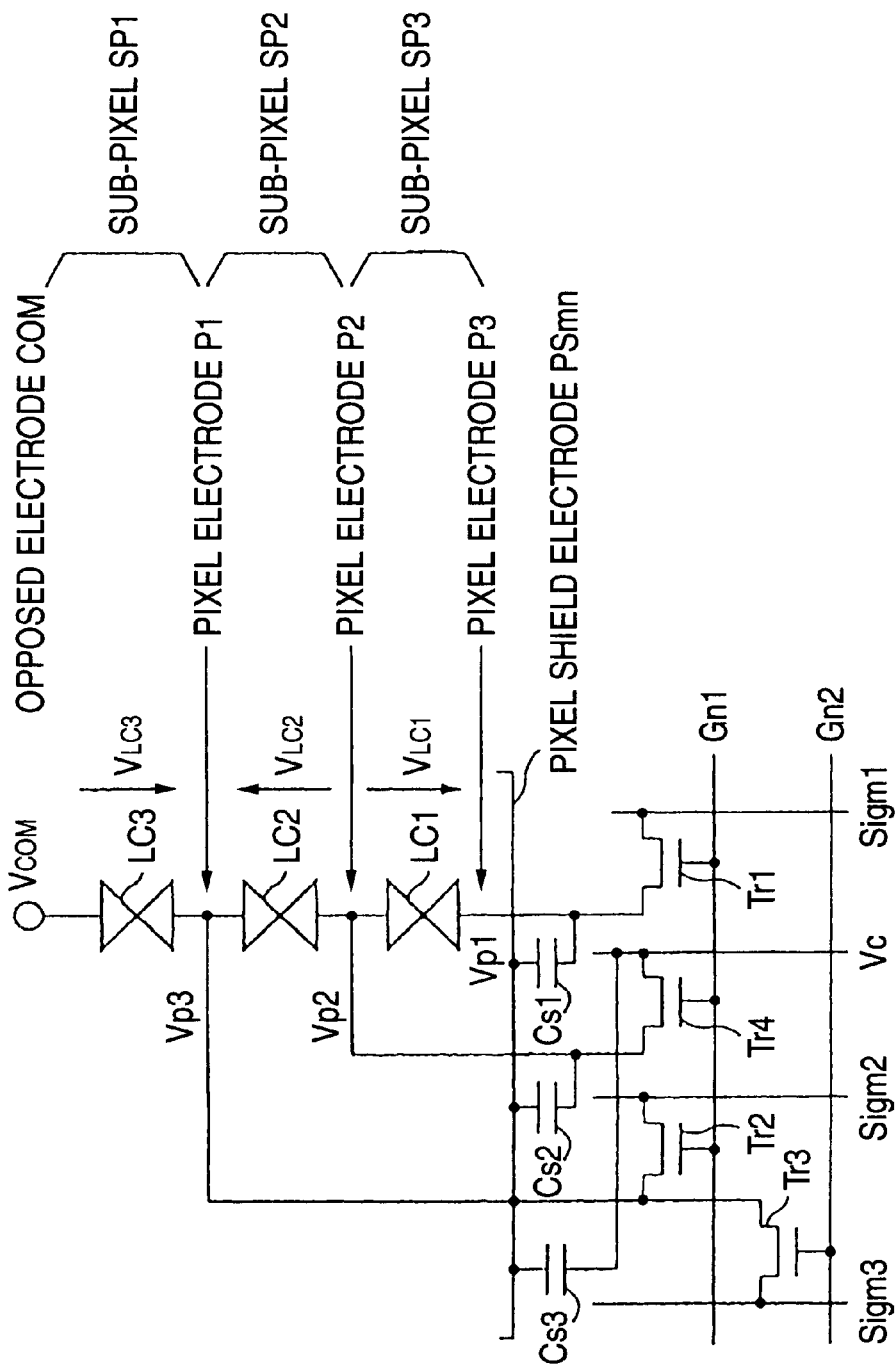
FIG. 6 is an equivalent circuit diagram of a pixel portion according to the first embodiment of the present invention.
Figure 7:
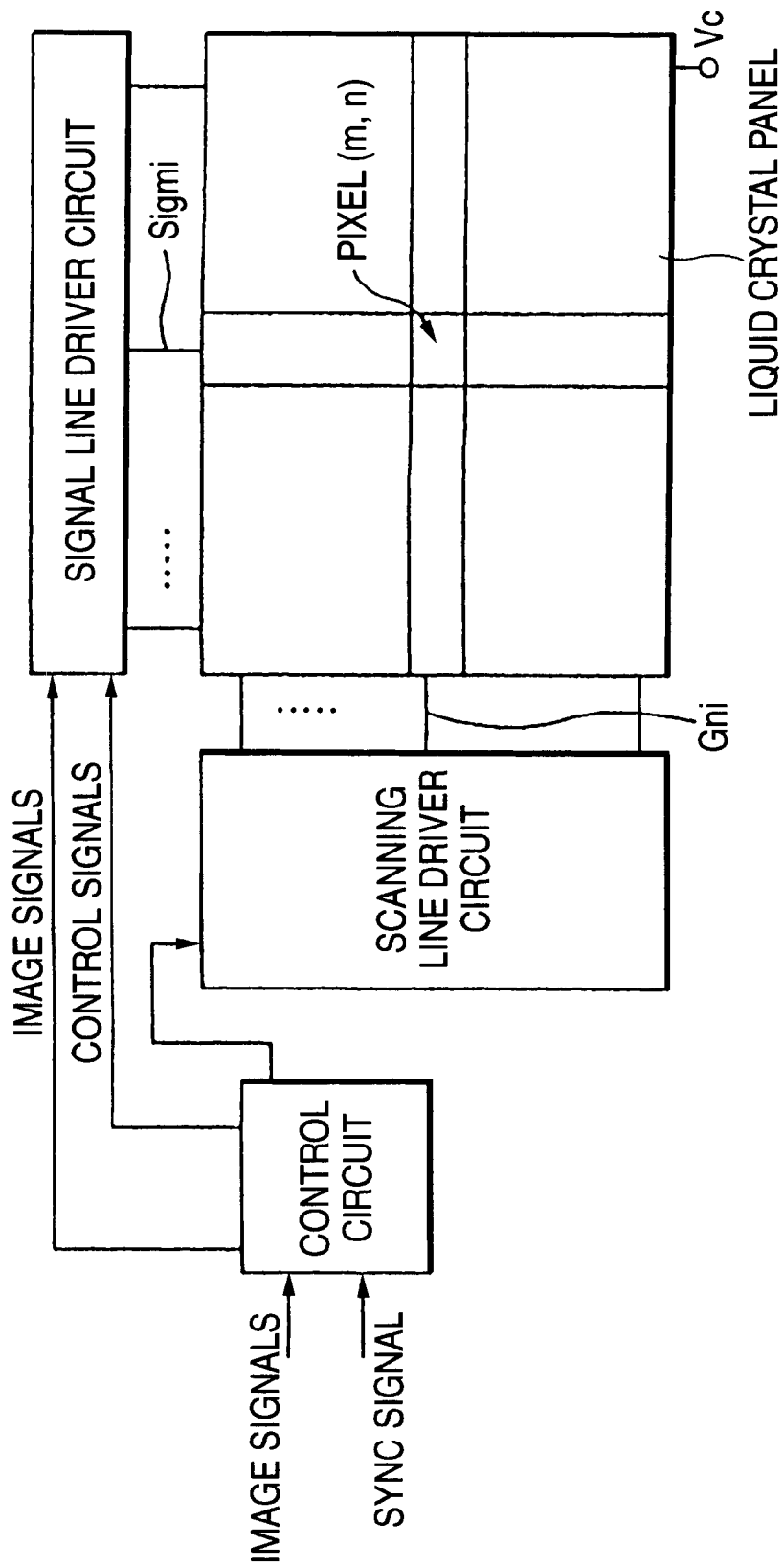
FIG. 7 shows the configuration of driver circuits according to the first embodiment of the present invention.

FIG. 6 shows a circuit configuration of a pixel portion, and FIG. 7 is a block diagram showing the entire configuration of a display device.

Three liquid crystal layers LC1–LC3 of cyan, magenta, and yellow are provided for an mth-column/nth-row pixel. Three sub-pixels SP1–SP3 are each disposed between three pixel electrodes P1–P3 and an opposed electrode COM. A potential Vcom is applied to the opposed electrode COM.

To determine potentials Vp1–Vp3 of the respective pixel electrodes P1–P3, active elements (in this case, thin-film transistors (TFTs) Tr1–Tr4) are connected to the pixel electrodes P1–P3.

The TFTs Tr1–Tr4 may be formed, for example, of amorphous silicon TFTs, polysilicon TFTs, and crystal silicon TFTs, or may be formed by using other semiconductor materials.

The drains of the TFTs Tr1 and Tr4 are connected to the respective pixel electrodes P1 and P2, and the drains of the TFTs Tr2 and Tr3 are connected to the pixel electrode P3. A signal line Sigml and a scanning line Gnl are connected to the source and the gate, respectively, of the TFT Tr1. A signal line Sigm2 and the scanning line Gnl are connected to the source and the gate, respectively, of the TFT Tr2. A signal line Sigm3 and a scanning line Gn2 are connected to the source and the gate, respectively, of the TFT Tr3. A line Vc is to be supplied with a potential approximately equal to the center potential of an image signal that is an AC signal for the liquid crystal and is connected to the source of the TFT Tr4. The scanning line Gn1 is connected to the gate of the TFT Tr4. It is desirable that the active elements and the wiring lines, such as the signal lines and the scanning lines, be formed on a single substrate.

A pixel shield electrode PSmn is disposed between the pixel electrode P1 and at least part of the signal lines Sigmi, the scanning lines Gn1, the active elements, etc., and electrical connection is thus made so that the pixel shield electrode PSmn is given the same potential as the pixel electrode P3.

The pixel electrodes P1–P3 are provided with respective auxiliary capacitors Cs1–Cs3 for inhibiting a variation in the potential difference across each liquid crystal layer owing to leakage through the liquid crystal layer, or coupling. One electrode of the auxiliary capacitor Csl for the sub-pixel SP1 is connected to the pixel electrode P1, and the other electrode is connected to the pixel electrode P3. One electrode of the auxiliary capacitor Cs2 for the sub-pixel SP2 is connected to the pixel electrode P2, and the other electrode is connected to the pixel electrode P3. One electrode of the auxiliary capacitor Cs3 for the sub-pixel SP3 is connected to the pixel electrode P3, and the other electrode is connected to a line having a predetermined potential (in this case, the line Vc). Although the connection method of the auxiliary capacitors Cs1–Cs3 depends on the driving method described below, the electrodes of the auxiliary capacitor Cs1 may be connected to the respective pixel electrodes P1 and P2. Further, the electrodes of the auxiliary capacitor Cs3 may be connected to the pixel electrode P3 and a one-line-preceding scanning line, respectively (see FIG. 11). To simplify the layout, the auxiliary capacitor Cs3 may be connected to the scanning line Gn1.

As shown in FIG. 7, the signal lines Sigmi are connected to a signal line driver circuit and supplied with mth-line image signals for AC driving of the liquid crystals. The scanning lines Gni are connected to a scanning line driver circuit and supplied with selection-level signals in order of Gn1 and Gn2. The selection-level signal is a high-level signal if the TFTs Tr1–Tr4 are n-channel transistors. The signal line driver circuit and the scanning line driver circuit are supplied, from a control circuit, with control signals, such as a clock signal and a start pulse, for the driver circuits as well as image signals for AC driving.

Figure 9:
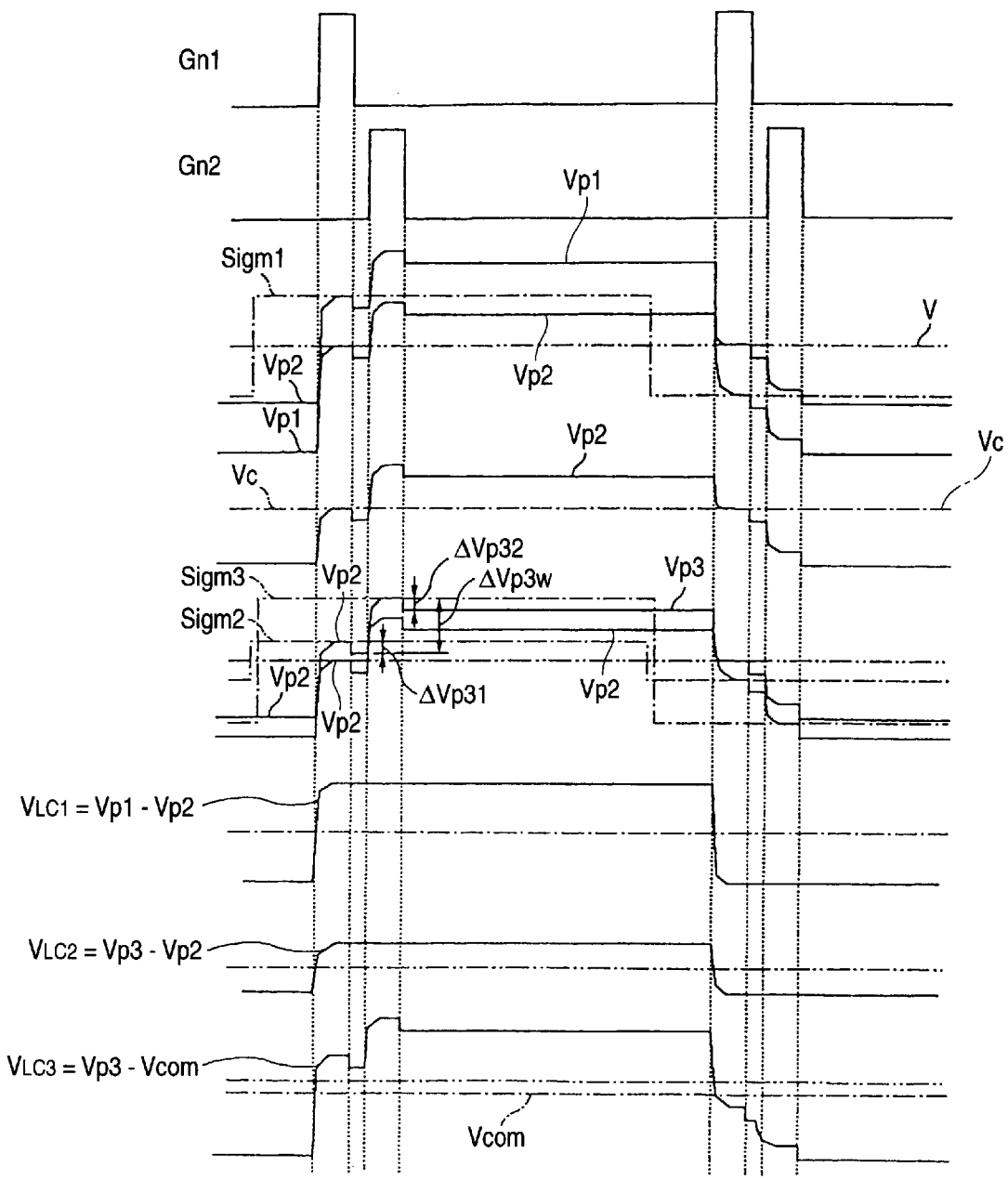
FIG. 9 shows signal waveforms at respective members according to the first embodiment of the present invention.

FIG. 9 shows signal waveforms according to this embodiment of the present invention. The following description is directed to the case of using e-channel transistors, and the selection level is assumed to be a high level unless otherwise specified. It goes without saying that a device can be constructed by using p-channel transistors. When the scanning line Gn1 is given a high-level signal, the TFTs Tr1, Tr2, and Tr4 are turned on, and hence a signal line potential Vsigml, a wiring line potential Vc, and a signal line potential Vsigm2 are applied to the respective pixel electrodes P1–P3. The potential Vc is set approximately equal to a center signal line potential Vsigc. As a result, potential differences VLC1 and VLC2 that are applied to the respective liquid crystal layers LC1 and LC2 during a period when the potential of the scanning line Gn1 is at a high level are as follows:

$$VCL1 = Vp1 - Vp2 = Vsigm1 - Vsigc$$

$$VLC2 = Vp3 - Vp2 = Vsigm2 - Vsigc.$$

Prescribed potential differences are applied to the sub-pixels SP1 and SP2 in this manner.

Subsequently, the potential of the scanning line Gn1 becomes a low level, and the TFTs Tr1, Tr2, and Tr4 are turned off. Then, the potential of the scanning line Gn2 becomes a high level, and the TFT Tr3 is turned on, whereby the potential of the pixel electrode P3 becomes equal to a signal line potential Vsigm3. Since the TFTs Tr1, Tr2, and Tr4 are off, the pixel potentials Vp1 and Vp2 of the respective pixel electrodes P1 and P2 are in a floating state. When the pixel potential Vp3 changes from the potential immediately before the turning-on of the TFT Tr3 to the signal line potential Vsigm3, a potential variation $\Delta Vp3w$ occurs that corresponds to the difference between the above two potentials. A feedthrough voltage $\Delta Vp3\ 1$ occurs in the TFT Tr2 when the potential of the scanning line Gn1 becomes a low level. Therefore, the above-mentioned potential immediately before the turning-on of the TFT Tr3 is the signal line potential Vsigm2 minus the feedthrough voltage $\Delta Vp31$.

At this time, since the potential of the shield electrode PSmn is equal to the pixel potential Vp3 and is determined by the TFT Tr3, the coupling between the pixel electrode P1 and the wiring lines is inhibited. and the potential of the pixel electrode P1 is thereby allowed to vary by approximately $\Delta Vp3w$. Since the pixel electrode P2 is interposed between the pixel electrodes P1 and P3, when the potential of each of the pixel electrodes P1 and P3 varies by $\Delta Vp3w$, the potential of the pixel electrode P2 varies by approximately the same voltage. When the potential of the scanning line Gn2 falls, a feedthrough voltage $\Delta Vp32$ is added to the pixel potential Vp3. This variation also causes variations of the pixel potentials Vp1 and Vp2 in the same manner as described above, and hence the potential differences VLC1 and VLC2 remain the same as written in the state in which the potential of the scanning line Gn1 was at a high level. Since the pixel potential Vp3 is varied by a voltage approximately equal to the feedthrough voltage $\Delta Vp32$, the positive and negative sides of the AC voltage are balanced with each other by making the opposed electrode potential Vcom lower than a center potential Vsigm3c of the signal line potential Vsigm3 by about $\Delta Vp32$.

Figure 8:
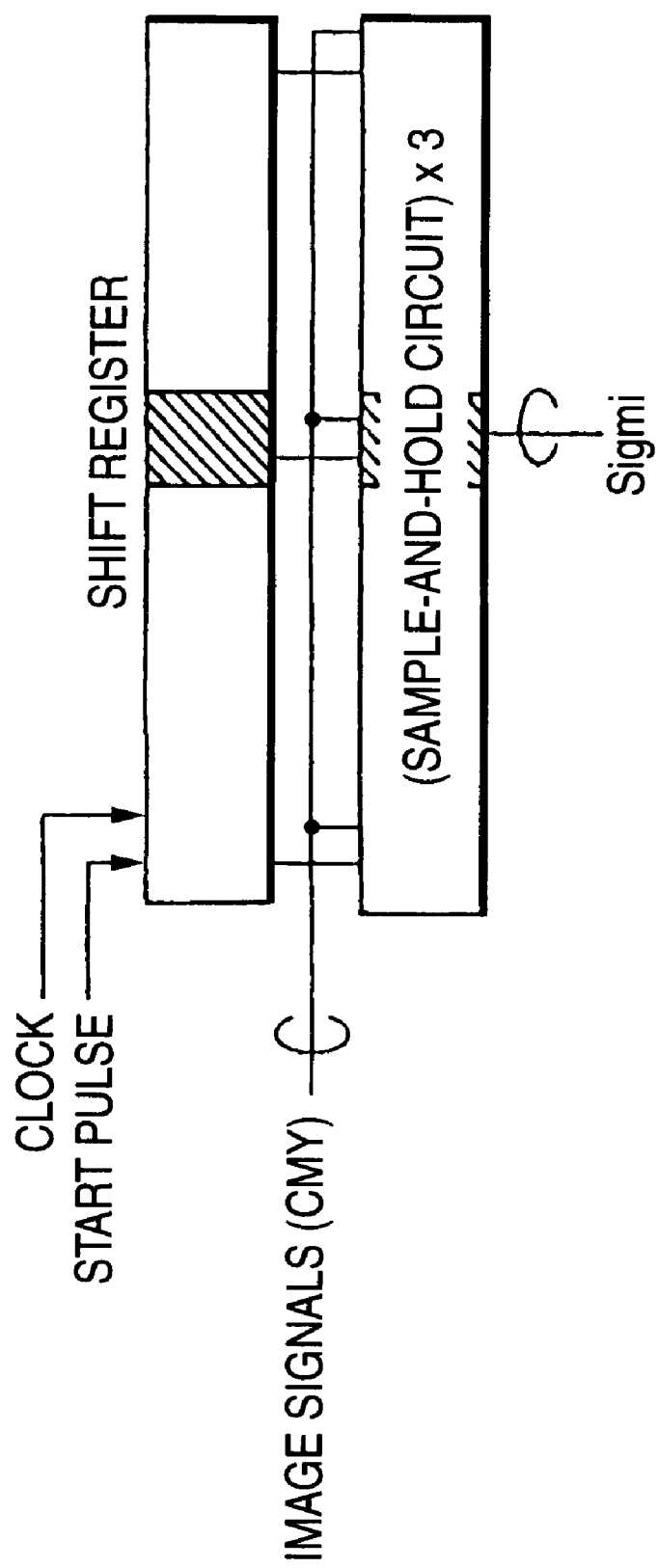
FIG. 8 shows the configuration of a signal line driver circuit shown in FIG. 7.

The signal line driver circuit can be the same as in the conventional TFT-LCD. FIG. 8 shows an example of a signal line driver circuit that can be used in this embodiment of the present invention. The sampling timing of three sample-and-hold circuits is determined by an output of a shift register, and mth-line signals of CMY image signals are sampled. The signal lines Sigmi are driven via an analog buffer. The signal line driver circuit may be of other types such as a type in which selection is made among reference signals and a type in which digital signals are latched and potentials for signal lines are formed by D/A converters. In any of those cases, the same signal driver circuit as in the conventional TFT-LCD can be used and the controllability of gradation signals can be kept high.

Since the scanning line driver drives the two scanning lines Gn1 and Gn2 for one pixel, the scanning is performed two times faster than in the conventional case if the operation speed of the signal line driver is the same as in the conventional case. It is appropriate to add a circuit for preventing an event so that pulses that are supplied to the scanning lines Gn1 and Gn2 do not become a high level at the same time.

As described above, by providing the shield electrode PSmn, the pixel electrodes that are rendered in a floating state can be given prescribed potential variations when signals are written to one pixel that consists of the sub-pixels SP1–SP3. That is, the coupling between the pixel electrodes and the signal lines and the scanning lines can be inhibited. An improvement can be made in the phenomenon in which the potentials of the pixel electrodes that are rendered in a floating state are hard to vary. As a result, the potential differences across the respective sub-pixels can be controlled precisely. Hence good images that are free of crosstalk or the like can be displayed.

Figure 10:
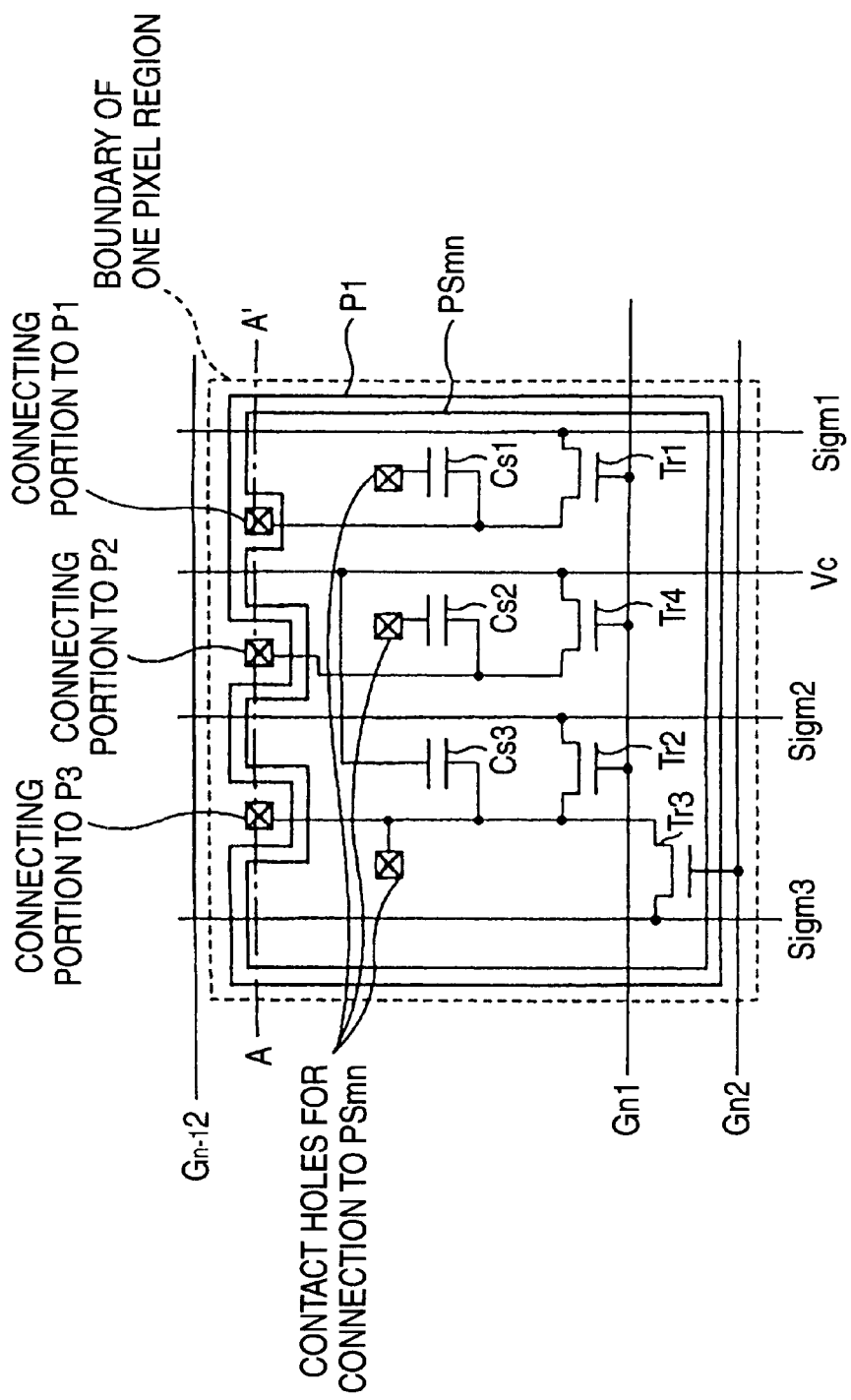
FIGS. 10 and 11 show plan layouts of array substrates according to the first embodiment of the present invention.
Figure 11:
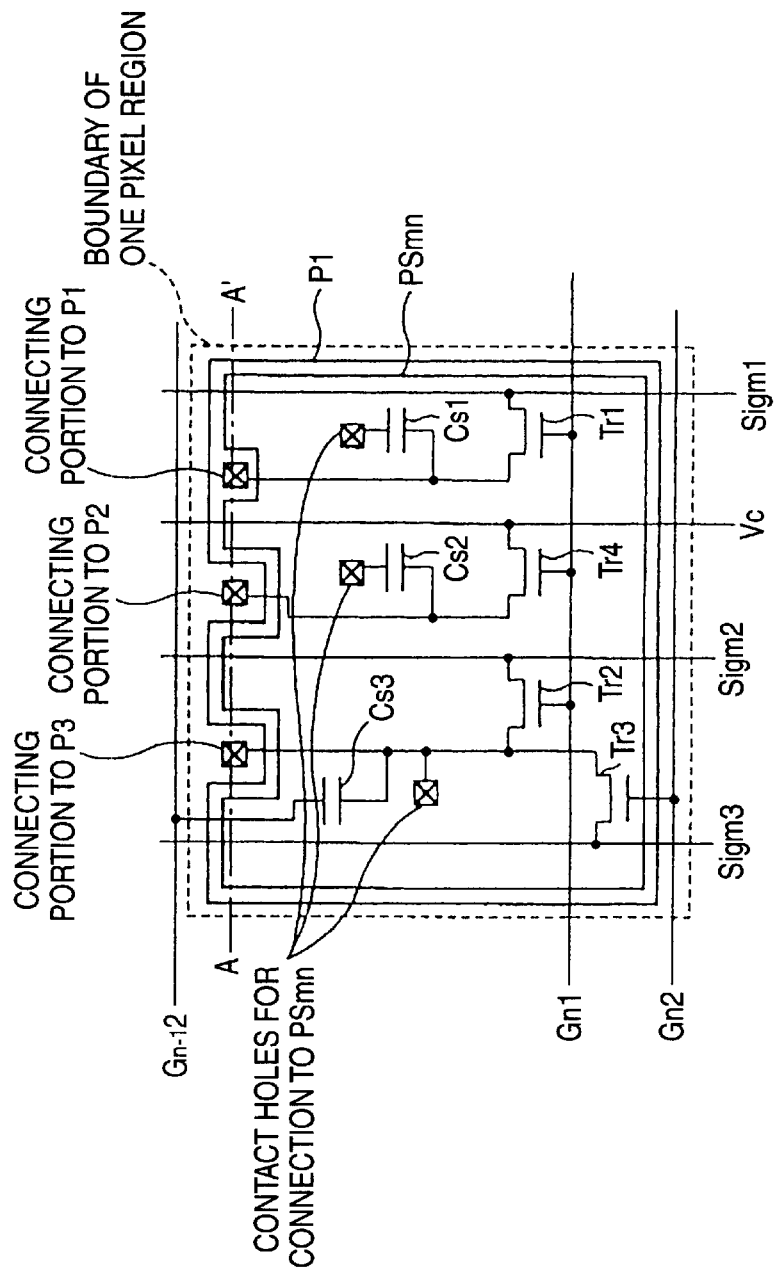
Figure 12:
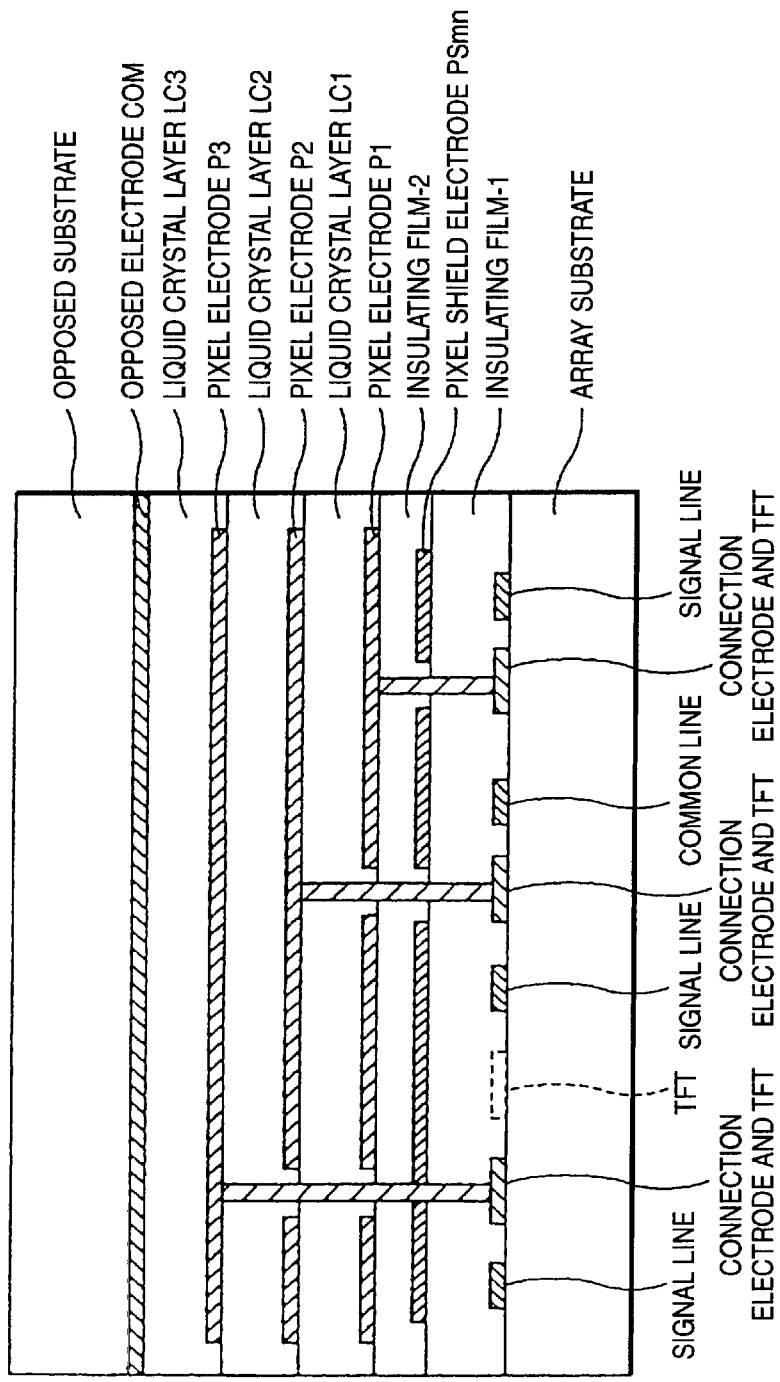
FIG. 12 is a sectional view of the array substrates of FIGS. 10 and 11.

FIGS. 10 and 11 schematically show plan layouts of TFT array substrates according to this embodiment of the present invention, and FIG. 12 is a sectional view including liquid crystal layers (i.e., a sectional view taken along line A-A' in FIGS. 10 or 11).

A manufacturing process etc. is described below.

An array substrate, formed, for example, of a glass substrate, a plastic substrate, or a plastic film is prepared. Signal lines, scanning lines, TFTs, and auxiliary capacitors are formed on the array substrate. An insulating film-1 made of, for example, a photosensitive acrylic resin, of about 2 $\mu$m in thickness is formed on those members, and through-holes for connection to members to be formed above are formed through the insulating film-1. Then, after Mo is deposited at a thickness of 200 nm by sputtering, a resist pattern is formed by a photoresist step. A pixel shield electrode PSmn is formed by etching the Mo film, using the resist pattern as a mask. The shield electrode PSmn is connected to a line leading to a pixel electrode P3. Then, an insulating film-2 made of, for example, a photosensitive acrylic resin, is applied at a thickness of about 2 $\mu$m and subjected to pattern formation of through-holes, rough surface for a reflection electrode, etc. Then, Al, Ag, an Al alloy, or the like is deposited by sputtering at a thickness of 200 nm and patterned into a pixel electrode P1. The pixel electrode P1 is also given a function of a reflection electrode. Subsequently, a liquid crystal layer LC1 is formed by applying guest-host liquid crystals that are sealed in microcapsules by printing. A transparent pixel electrode P2 made of an ITO-dispersed resin is formed thereon. Then, a liquid crystal layer LC2 and a transparent pixel electrode P3 are formed sequentially and a liquid crystal layer LC3 is formed thereon. Then, an opposed substrate provided with an opposed electrode COM is bonded to the TFT array substrate by a vacuum lamination method, whereby a liquid crystal panel is completed.

The insulating film-1 and the insulating film-2 may be an organic resin film made of, for example, BCB, or a non-photosensitive resin, an inorganic insulating film, such as a silicon oxide film, or a silicon nitride film formed by spin-on-glass, CVD, or sputtering. To reduce the degree of coupling, it is preferable that the insulating film-1 and the insulating film-2 have a large degree of thickness. Usually, it is desirable that their thickness be set at 1–5 $\mu$m. However, it is possible to form an auxiliary capacitor by the pixel electrode P1 and the shield electrode PSmn, in which case the insulating film-1 and the insulating film-2 may be given a prescribed thickness (e.g., 200–400 nm) suitable for such a structure.

Although in the above description microcapsules are used to form each liquid crystal layer, partitions may be formed by mixing together a monomer and a liquid crystal and polymerizing the monomer by applying light or heat. It is also possible to form partitions between liquid crystal layers by using a thin film (preferably having large permittivity).

The pixel electrodes may be made of SnOx, InOx-ZnOx, or a conductive transparent resin instead of containing ITO. Fine particles to be dispersed in a resin may be made of a material other than ITO.

Instead of an absorption-transmission mode guest-host liquid crystal, reflection-transmission mode liquid crystals such as a holographic PDLC and a cholesteric liquid crystal may be used. In the latter case, the pixel electrode P1 and the insulating film-2 may be used as a transparent electrode and a light absorption layer, respectively, or the pixel electrode P1 itself may be made of a light-absorptive material such as a carbon-dispersed resin.

The columnar electrodes for connecting the pixel electrodes to the lower electrodes may be formed at the same time as the formation of the pixel electrodes P2 and P3 by using the same material. The columnar electrodes may be formed by plating or by forming an electrode on the side face of a bank of a resin. The columnar electrodes may be formed either before or after the formation of liquid crystal layers. When a resin is used, the bank may assume a lattice shape rather than a pole shape.

In this embodiment, as shown in FIGS. 10 and 11, the shield electrode PSmn is disposed under the pixel electrode P1 so as to have approximately the same shape as the pixel electrode P1. This allows the pixel electrode P1 to be effectively shielded from the signal lines, the scanning lines, the TFTs, the auxiliary capacitors, etc. that are given prescribed potentials. The coupling between the pixel electrode P1 and the shield electrode PSmn can be weakened to a non-problematic level by properly adjusting the thickness of the insulating film-1, the electrode areas of the signal lines, and the capacitance of the auxiliary capacitors. An additional shield electrode that is given a fixed potential (which may be constant over the entire screen) may be disposed under the pixel shield electrode PSmn. This prevents variations in pixel potentials when the signal lines supply signals for other pixels, and hence the deterioration in image quality such as crosstalk can further be reduced.

In the first embodiment described above, the potential of the line for applying the potential Vc to the pixel electrode P2 can be changed in link with the opposed electrode potential Vcom instead of being fixed. For example, the potential Vc can be changed approximately in a range of the signal amplitude to change the polarity of potential differences applied to the liquid crystal layers for every scanning line or every several scanning lines. This measure allows the signal line driver to output signals having potential ranges of only one polarity, whereby the breakdown voltage rating of the signal line driver circuit can be decreased. In this type of driving. it is preferable to connect the auxiliary capacitor Cs3 of FIG. 6 to the Vc line.

Figure 13:
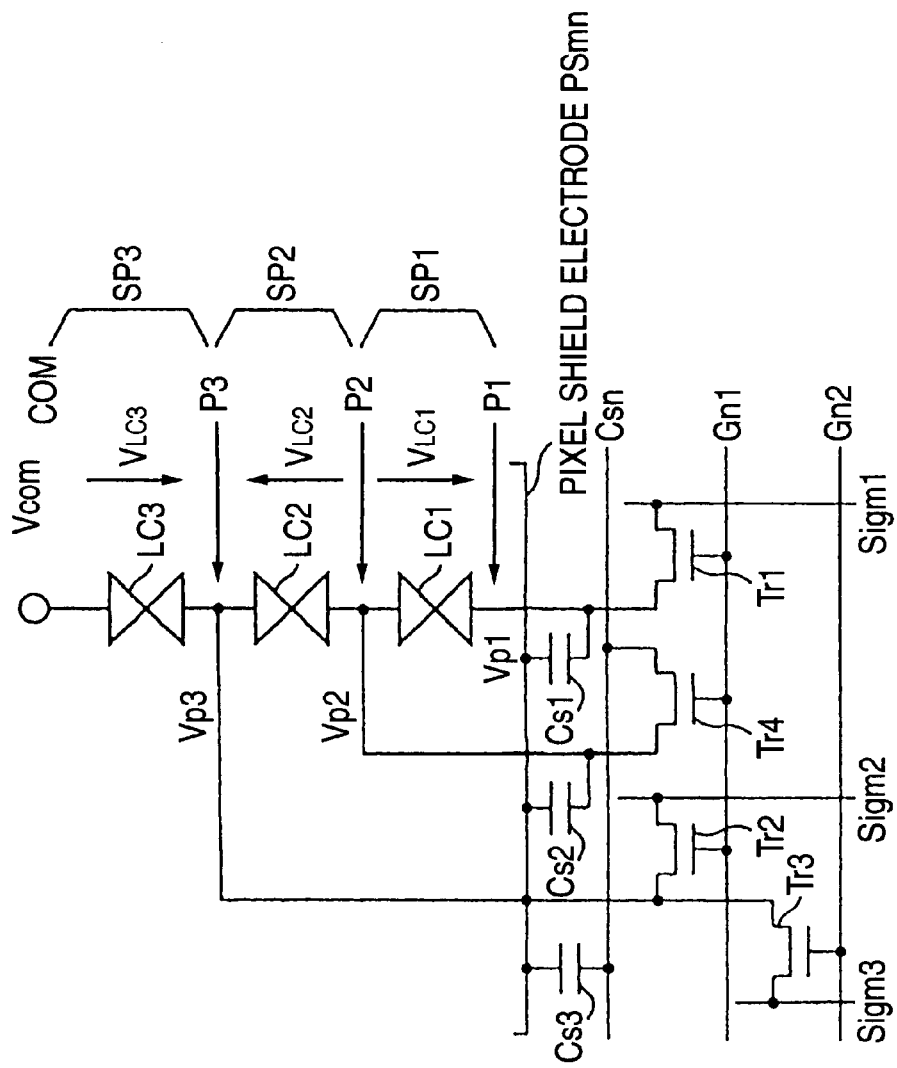
FIG. 13 is an equivalent circuit diagram of a pixel portion according to a modification of the first embodiment of the present invention.
Figure 14:
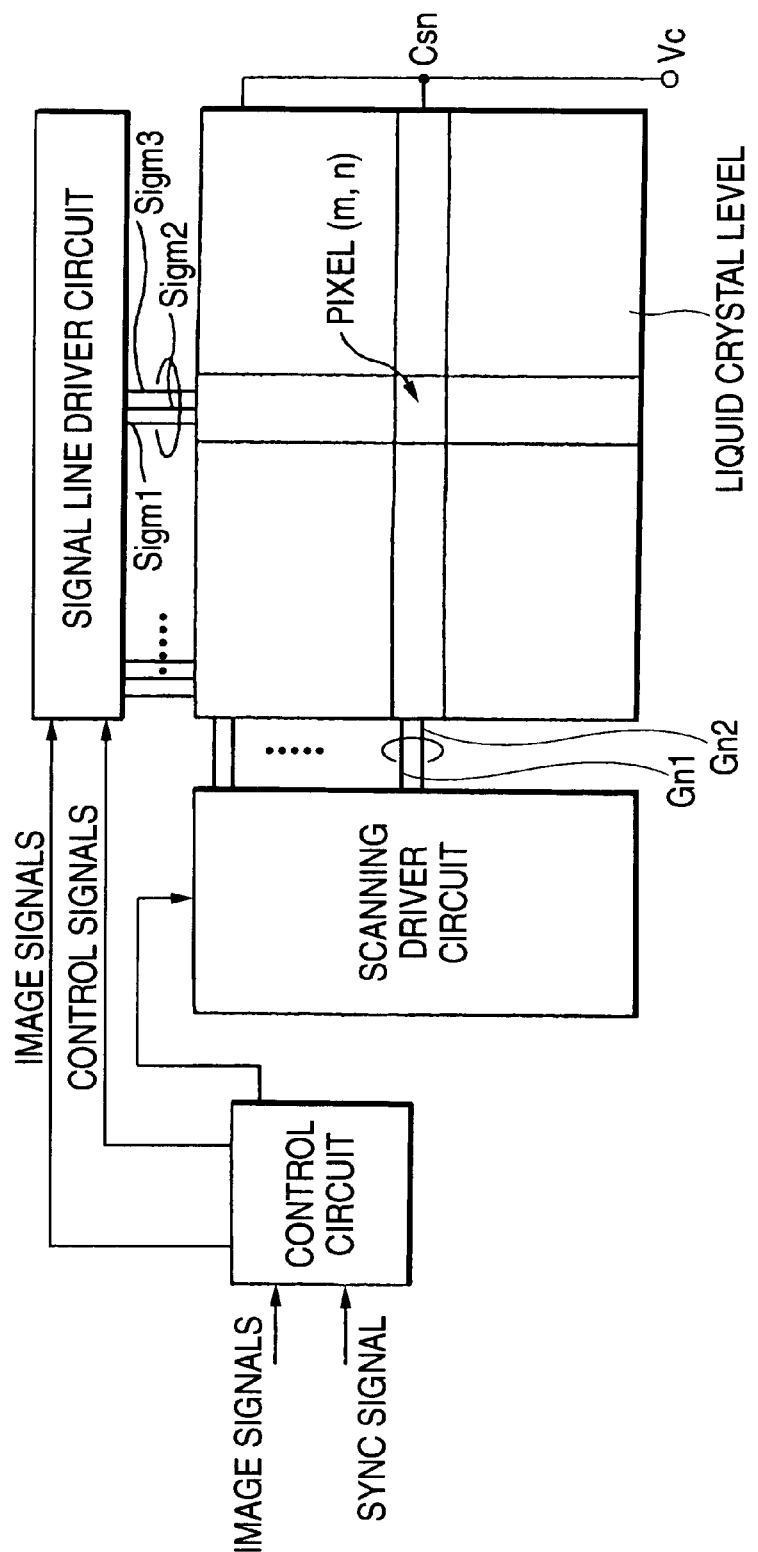
FIG. 14 shows the configuration of driver circuits according to the modification of the circuit of FIG. 13.

FIGS. 13 and 14 show a modification of the first embodiment of the present invention. In this modification, the line for applying the potential Vc to the pixel electrode P2 that is provided parallel with the signal lines Sigm1–Sigm3 in FIG. 6 is replaced by a line Csn that is provided parallel with the scanning lines Gn1 and Gn2. This allows the wiring lines to be formed at wider intervals, thereby contributing to increase in yield.

There may be provided, between the pixel shield electrode and the wiring lines such as the signal lines, the TFTs, the wiring lines for the auxiliary capacitors Cs, and other members, another shield electrode that is given a potential (generally a fixed potential) that is independent of potential variations of those wiring lines. Such an additional shield electrode may be provided between part of the pixel shield electrode and those wiring lines. This inhibits the phenomenon in which the potential of the pixel shield electrode is varied by potential variations of those wiring lines, thereby making it possible to provide good image quality with only a low level of crosstalk as caused by potential variations at the pixel electrodes. This type of additional shield electrode can also be applied to other embodiments.

Figure 15:
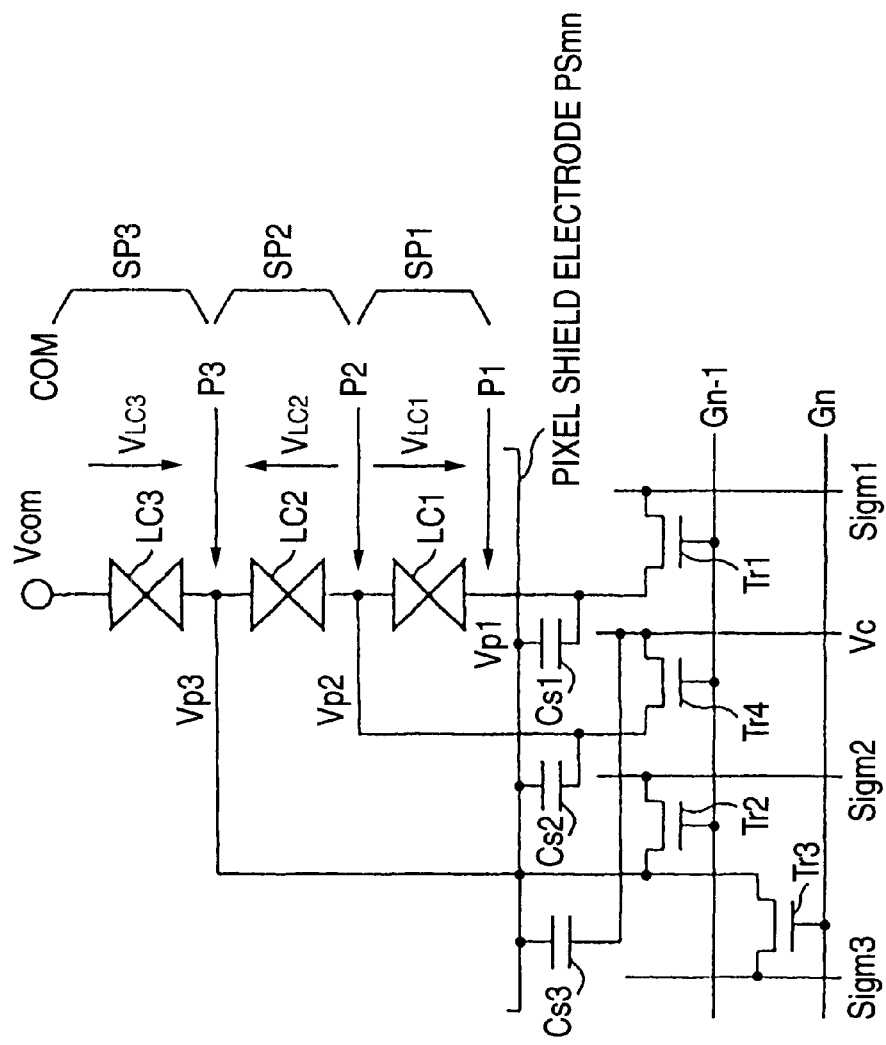
FIG. 15 is an equivalent circuit diagram of a pixel portion according to a second embodiment of the present invention.

Next, a second embodiment of the present invention is described with reference to FIGS. 15 and 16.

In the pixel portion of this embodiment of the present invention, the scanning line for controlling the TFTs Tr1, Tr2, and Tr4 is commonized with a scanning line Gn-1 of the preceding stage. This enables the selection time of the scanning line Gn to be two times longer than in the first embodiment of the present invention.

However, the method of supplying signal line potentials is changed from that in the first embodiment of the present invention. That is, when a scanning line Gn-1 for pixels that one-line precede the pixel (m, n) is selected, an image signal for the sub-pixel SP3 of a pixel (m, n-1) is supplied to the signal line Sigm3 and image signals for the sub-pixels SP1 and SP2 of the pixel (m, n) are supplied to the respective signal lines Sigm1 and Sigm2. In other words, during a period when the potential of the scanning line Gn-1 is at a high level, signals are supplied at the same time to the pixel electrode P3 of the pixel (m, h-1) and the pixel electrodes P1 and P2 of the pixel (m, n). This may be realized by providing a line memory for storing an image signal of one line and delaying part (signal lines Sigm1 and Sigm2) of image signals for the stacked liquid crystal layers by one-line period. The line memory may be provided inside the signal line driver circuit.

Figure 16:
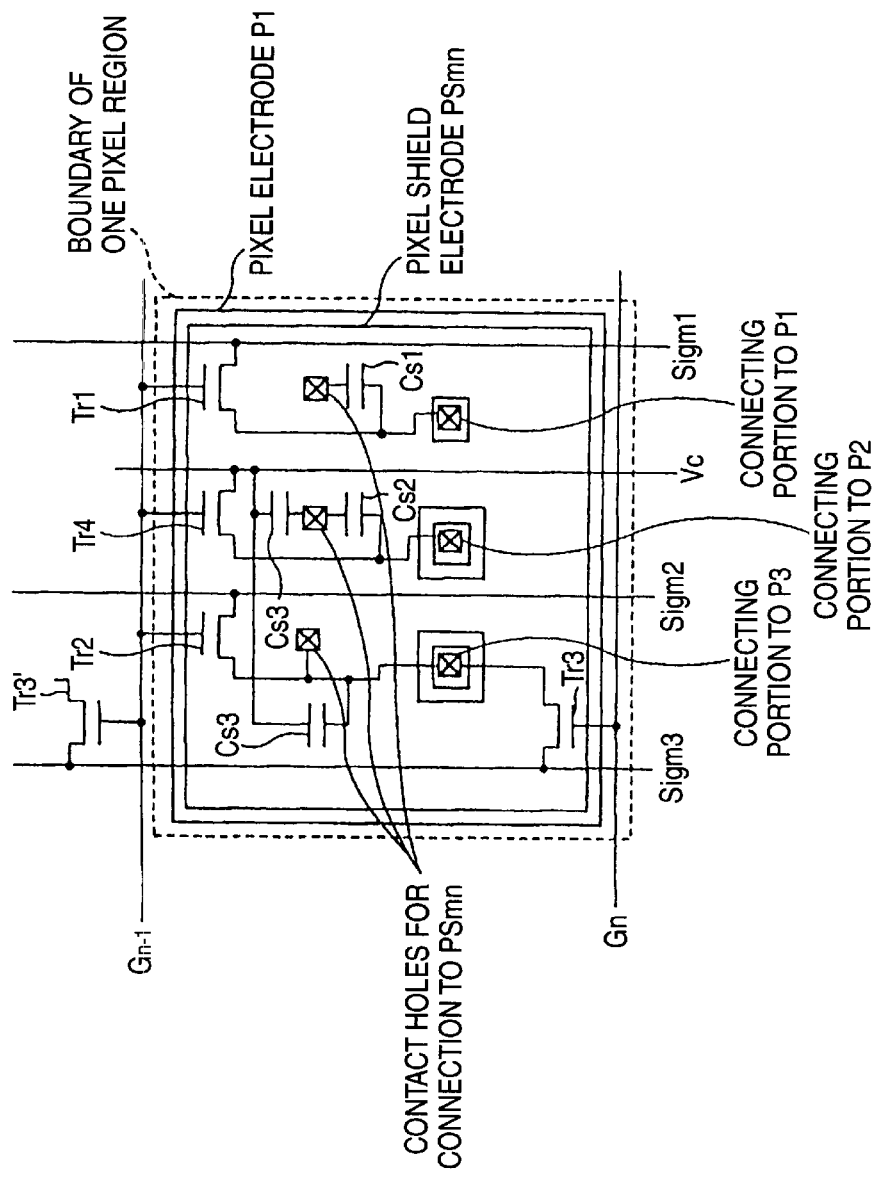
FIG. 16 shows a plan layout of an array substrate according to the second embodiment of the present invention.
Figure 17:
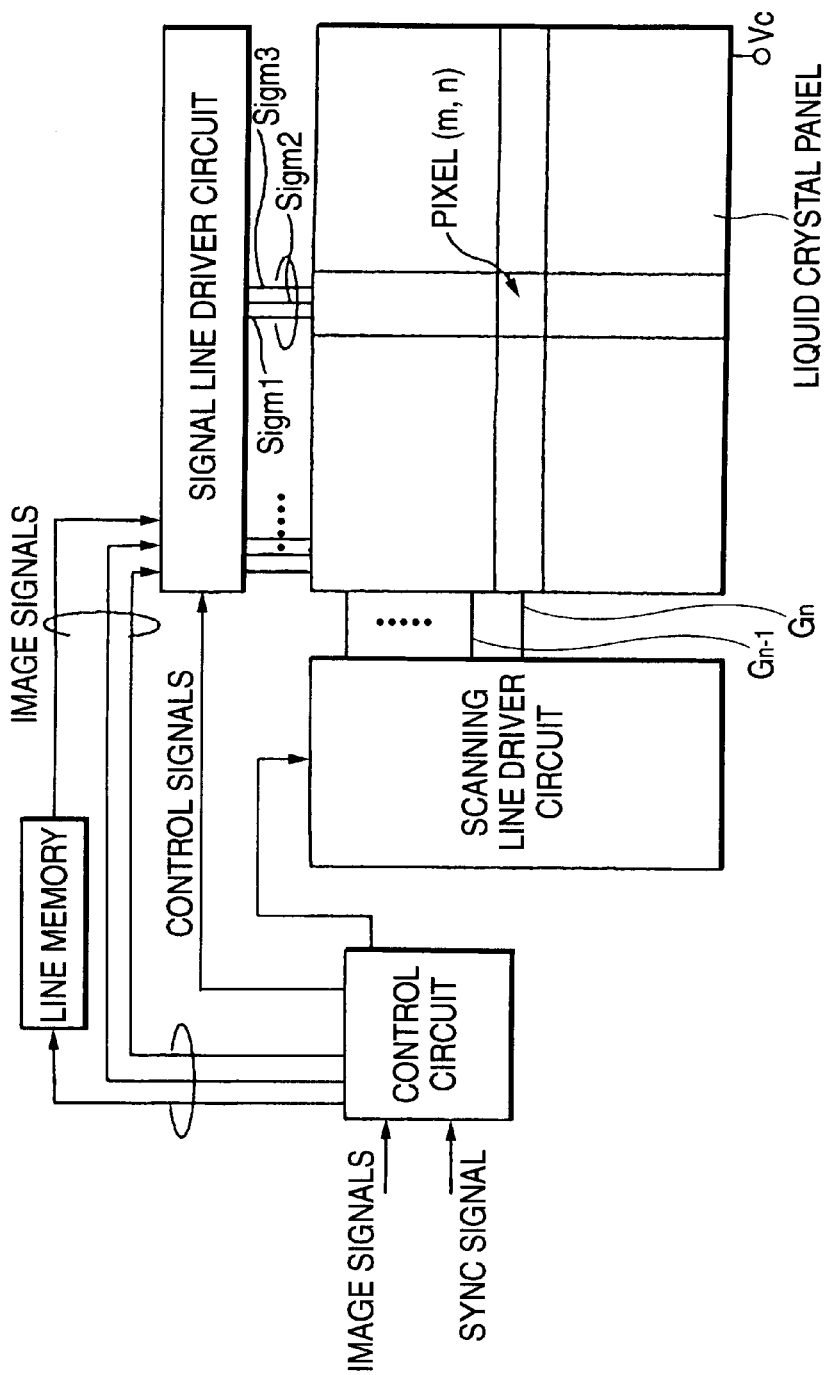
FIG. 17 shows the configuration of driver circuits according to the second embodiment of the present invention.

FIG. 17 is a block diagram of a circuit in which image signals to be supplied to the signal line driver circuit are delayed by a line memory. The configuration of the liquid crystal panel is as shown in FIGS. 15 and 16. The scanning line driver circuit is so configured as to drive one signal line for one pixel. The signal line driver circuit is the same as shown in FIG. 7.

Turning now to a desciprtion of the structure of sub-pixels, wherein the sub-pixels SP1–SP3 are called subpixels Y (yellow), M (magenta), and C (cyan), respectively. Externally provided image signals are subjected to prescribed conversions in the control circuit, and then a C image signal for the sub-pixel C is input to the line memory and held there for one scanning period. M and Y image signals are input to the signal line driver circuit on a real-time basis and a one-scanning-period-preceding image signal that is stored in the line memory is also input, as a C image signal, to the signal line driver circuit. With this measure, M and Y signals of the nth line are supplied to the respective signal lines Sigm1 and Sigm2 during a period in which the potential of the scanning line Gn-1 of the (n-1)th line is at a high level, whereby the signals are written to the sub-pixels M and Y of the pixel (m, n) via the respective TFTs Tr1 and Tr2. At the same time, a signal is written to the sub-pixel C of the pixel (m, n-1) via a TFT Tr3 that is connected to the pixel (m, n-1).

Figure 18:
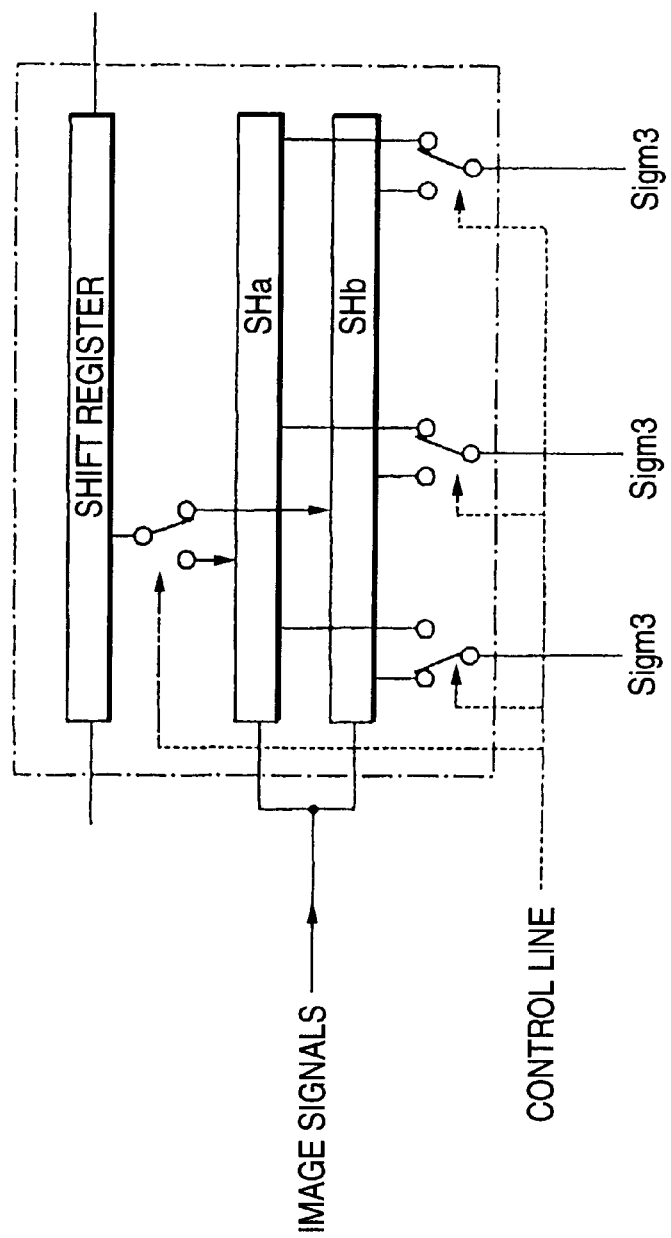
FIG. 18 shows the configuration of a signal line driver circuit shown in FIG. 17.

FIG. 18 shows an example in which a memory function is provided inside the signal line driver circuit. FIG. 18 shows a portion of the signal line driver circuit that corresponds to pixels of one column. The sampling timing of two sample-and-hold circuits SHa and SHb is determined based on an output of one-bit portion of a shift register. Each of the sample-and-hold circuits SHa and SHb can hold YMC signals for pixels of one column. Signals are sampled by one of the sample-and-hold circuits SHa and SHb while a switching control of every scanning period is performed based on a signal that is supplied from a control line. A one-scanning-line-preceding signal can be generated and supplied to the signal line Sigm3 by supplying outputs of different sample-and-hold circuits to the signal line Sigm3 for one color and the signal lines Sigm1 and Sigm2 for the other two colors. A similar concept may be used in a D/A converter type configuration.

Features in the layout of an array substrate are further described below with reference to FIG. 16. In this embodiment of the present invention, each scanning line can be formed between pixels because the number of scanning lines Gn is the same as the number of columns of pixels. Therefore, overlapping portions of the pixel electrodes and the scanning line can be eliminated or reduced. As a result, the coupling between the scanning line and the pixel electrode P1 or the pixel shield electrode PSmn can be weakened. Therefore, a feedthrough voltage that is caused by such coupling at the time of falls of scanning line pulses can be reduced, and hence potential differences being held no longer decrease undesirably. As a result, the gate potential ranges for turning off the TFTs can be reduced, which leads to reduction in power consumption. Further, the variation of the feedthrough voltage can be reduced, which leads to improvement in image quality.

Although in FIG. 16 the auxiliary capacitor Cs3 is formed between the signal lines Sigm2 and Sigm3, in this embodiment of the present invention, it may be formed in the vicinity of the Vc line. This also applies to the first and other embodiments of the present invention.

Figure 19:
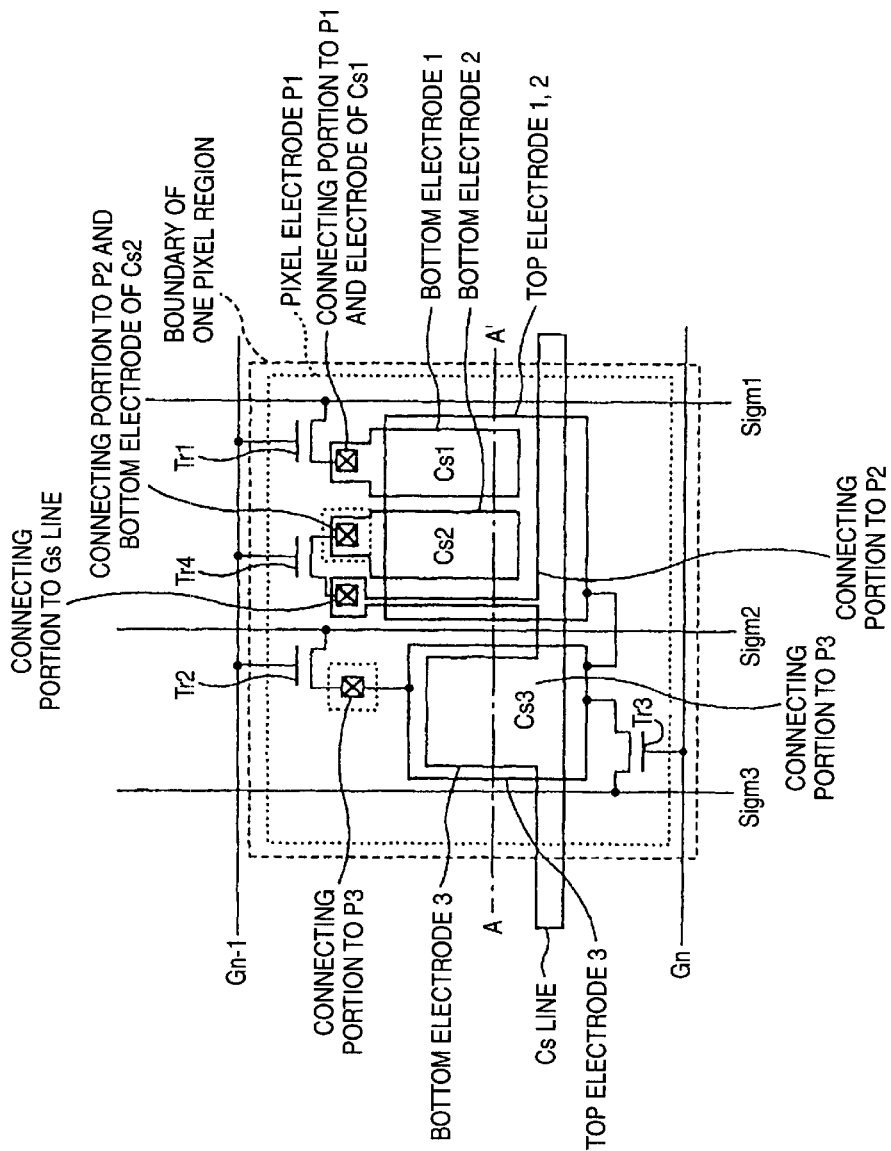
FIG. 19 shows a plan layout of an array substrate according to a third embodiment of the present invention.
Figure 20:
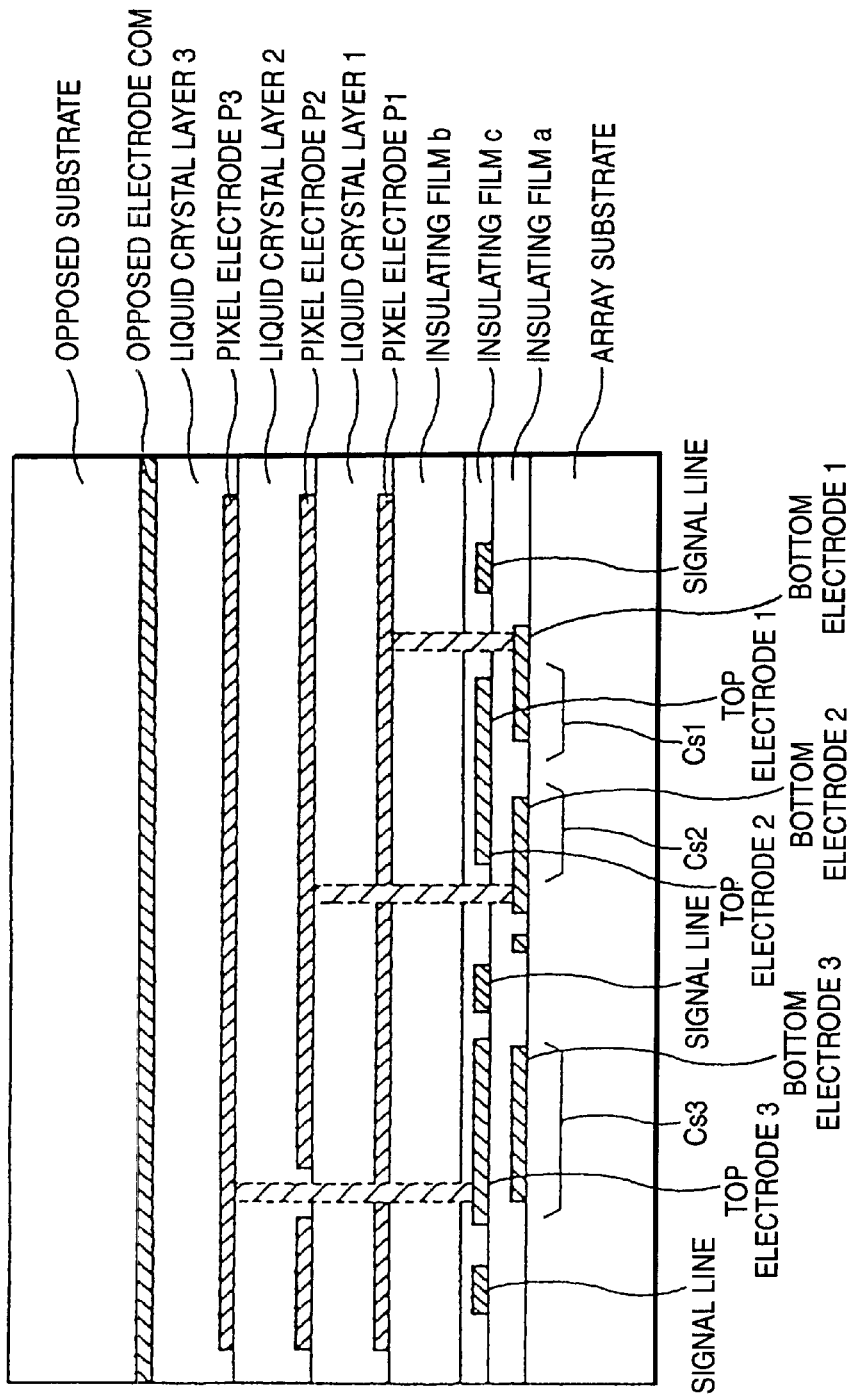
FIG. 20 is a sectional view of the array substrate of FIG. 19.

Next, a third embodiment of the present invention is described with reference to FIGS. 19 and 20. FIG. 20 is a sectional view taken along line A-A' in FIG. 19. In this embodiment of the present invention, the pixel shield electrode is provided mainly in an auxiliary capacitor portion that occupies the largest area and would otherwise cause a coupling problem, rather than over the entire pixel. One terminal of each of a first auxiliary capacitor Cs1 and a second auxiliary capacitor Cs2 are connected to a first electrode and a second electrode of a pixel. The other terminals of the auxiliary capacitor Cs1 and Cs2 are connected to an upper electrode of a third auxiliary capacitor Cs3.

An example of a manufacturing process according to this embodiment of the present invention is described below in which inverted staggered structure amorphous silicon TFTs are used.

MoW, Al, an Al alloy, or the like is deposited on a glass substrate or a plastic substrate at a thickness of 100–500 nm by sputtering, and then patterned into a scanning line and gate electrodes of TFTs. At the same time, a Cs line, a bottom electrode-1 of an auxiliary capacitor Cs1, a bottom electrode-2 of an auxiliary capacitor Cs2, a bottom electrode-3 of an auxiliary capacitor Cs3, and wiring lines to cross a signal line Sigm2 are formed by the same patterning step, using the same material which formed the scanning line.

Subsequently, an insulating film a as a gate insulating film made of SiNx or SiNx/SiOx (lamination) is formed at a thickness of about 100–500 nm. An amorphous silicon film of about 20–1200 nm in thickness is formed thereon. A SiNx film of about 100–500 nm in thickness is formed on the amorphous silicon film. After upper insulating films are sequentially formed in this manner by plasma CVD or the like and patterned by back exposure, an n+ semiconductor layer is formed by plasma CVD or the like. After the n+ semiconductor layer is patterned properly, through-holes for connection to the bottom electrodes are formed. Thereafter, electrodes to serve as sources, drains, and signal lines are formed by depositing a conductive material such as Mo, Mo/Al (lamination), or ITO by sputtering or the like and then patterning it. At the same time, a top electrode-1, 2, and 3 of the respective auxiliary capacitors Cs1–Cs3 are formed.

Subsequently, after the portions of the n+ semiconductor layer on the channels are etched out, an insulating film c as a passivation insulating film made of SiNx or the like is formed. Then, an insulating film b as an interlayer insulating film that is an organic insulating film made of a photosensitive acrylic resin, BCB, or the like is formed at a thickness of about 1–10 μm so as to have proper contact holes. A pixel electrode P1, a liquid crystal layer LC1, a pixel electrode P2, a liquid crystal layer LC2, a pixel electrode P3, and a liquid crystal layer LC3 are sequentially formed on the insulating film b, and an opposed substrate that is formed with an opposed electrode is placed thereon, whereby a liquid crystal panel is completed.

The TFTs may also be polysilicon TFTs or the like. Although in such a case a different manufacturing process is employed as exemplified by execution of excimer laser annealing and the TFT structure is changed (e.g., the planar structure is employed), the manners of electrode formation and insulating film formation can be changed in accordance with those differences.

The areas of the auxiliary capacitors Csi are increased to increase their capacitance. However, increasing the areas of the auxiliary capacitors Csi leads to an increase in the coupling with the pixel electrodes. In view of this, as shown in FIGS. 19 and 20 the top electrode-3 is formed so as to be given the same potential as the pixel electrode P3, whereby the Cs line having a large area which is to be given a fixed potential can be shielded from the pixel electrode P1. That is, the top electrode-3 has a function equivalent to the function of the pixel shield electrode.

The driver circuits may have similar configurations to the configurations of the driver circuits of the second embodiment of the present invention. Although the coupling between the pixel electrode P1 and the signal lines is not zero, it can be weakened to a level that is substantially non-problematic by thickening the interlayer insulating film, decreasing the wiring line widths, and increasing the capacitance of the auxiliary capacitors. In particular, it is preferable to apply this embodiment of the present invention to a device in which the number of gradation levels is small.

Figure 21:
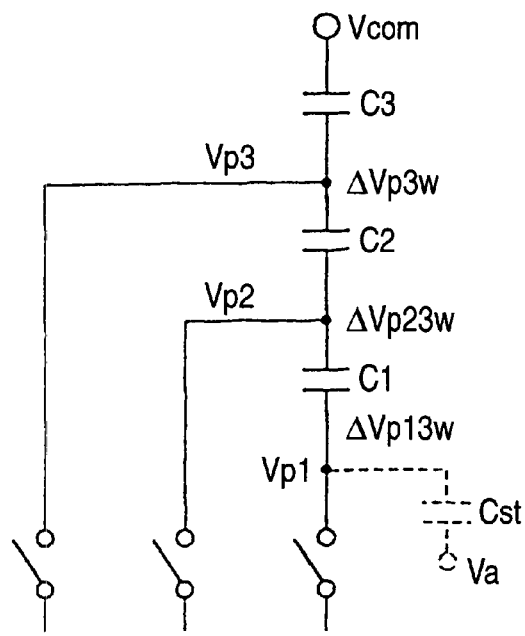
FIG. 21 is an equivalent circuit diagram used for calculating capacitive coupling at each portion.

FIG. 21 is a schematic circuit diagram showing the coupling weakening effect of the present invention.

C1–C3 represent capacitances of the respective sub-pixels to each of which a liquid crystal layer and an auxiliary capacitor contribute, and Cst represents a parasitic capacitance formed by the pixel electrode P1 and the wiring lines. In the case of the driving method of the first embodiment of the present invention. potential variations $\Delta Vp13w$ and $\Delta Vp23w$ at the respective pixel electrodes P1 and P2 that occur when the potential Vp3 is given a variation $\Delta Vp3w$ (Vsigm3–Vsigm2) are given by $$\Delta Vp13w = \Delta Vp3w(C1 \cdot C2 + C2 \cdot Cst)/(C1 \cdot C2 + C1 \cdot Cst + C2 \cdot Cst)$$

$$\Delta Vp23w = \Delta Vp3w(C1 \cdot C2)/(C1 \cdot C2 + C1 \cdot Cst + C2 \cdot Cst).$$

If it is assumed that C1=C2=C and Cst=αC, the above equations are modified as follows:

$$\Delta Vp13w = \Delta Vp3w(1+\alpha)/(1+2\alpha)$$

$$\Delta Vp23w = \Delta Vp3w/(1+2\alpha a).$$

The maximum value of $\Delta Vp3w$ is equal to Vsigmax, which is about 5V. Therefore, to make the variations $\Delta Vp13w$ and $\Delta Vp23w$ 10 mV or less, α is 0.001 or less. With assumptions that the relative permittivity and the thickness of each liquid crystal layer are 5 and about 5 μm, respectively, and the pixel area is about 90% of a square area having sides of about 150 μm, each liquid crystal layer has a capacitance Clc of about 0.18 pF. If the signal line width is about 5 μm and the insulating film b is an organic film having relative permittivity of 3 and a thickness of about 2 μm, Cst is equal to 9.5×10–15 F. Therefore, the ratio of Cst to Clc is 0.053, which is 53 times larger than the target value of α. If auxiliary capacitors are provided so that each of C1–C3 becomes one-order larger than Clc, the variations can be reduced to 50 mV, which is five times the above-mentioned target value. It can be said that even this value is allowable because gradation inversion does not occur as long as the number of gradation levels is small.

Figure 22:
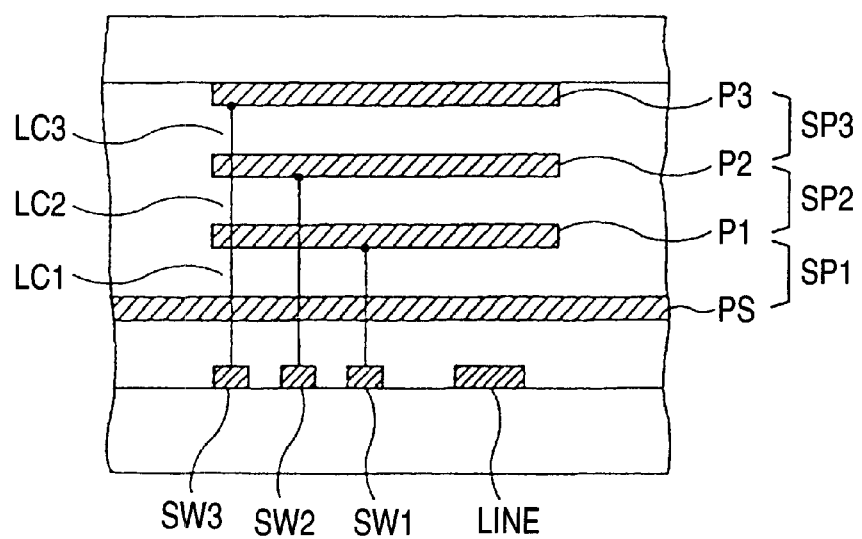
FIG. 22 shows a basic, conceptual configuration according to a fourth embodiment of the present invention.

FIG. 22 shows the basic configuration according to a fourth embodiment of the present invention.

Three liquid crystal layers LC1–LC3 corresponding to cyan, magenta, and yellow are disposed one on another. Three sub-pixels SP1–SP3 are each interposed between three stacked pixel electrodes P1–P3 and a shield electrode PS, whereby one pixel is formed. The shield electrode PS is disposed under the lowest pixel electrode P1. The shield electrode PS functions as a shield against underlying switching elements (thin-film transistors or the like) SW1–SW3 and a wiring LINE. The switching elements SW1–SW3 are connected to the respective pixel electrodes P1–P3.

To drive the pixels, prescribed potential differences are first applied to the respective sub-pixels SP2 and SP3 via the switching elements SW1–SW3. Then, a prescribed potential difference is applied to the sub-pixel SP1 in a state in which the pixel electrodes P2 and P3 have been rendered in a floating state by turning off the switching elements SW2 and SW3. At this time, the shield electrode PS is given a common potential, for example. As a result, the potential differences that have been applied to the respective sub-pixels SP2 and SP3 are held as they are.

Figure 23:
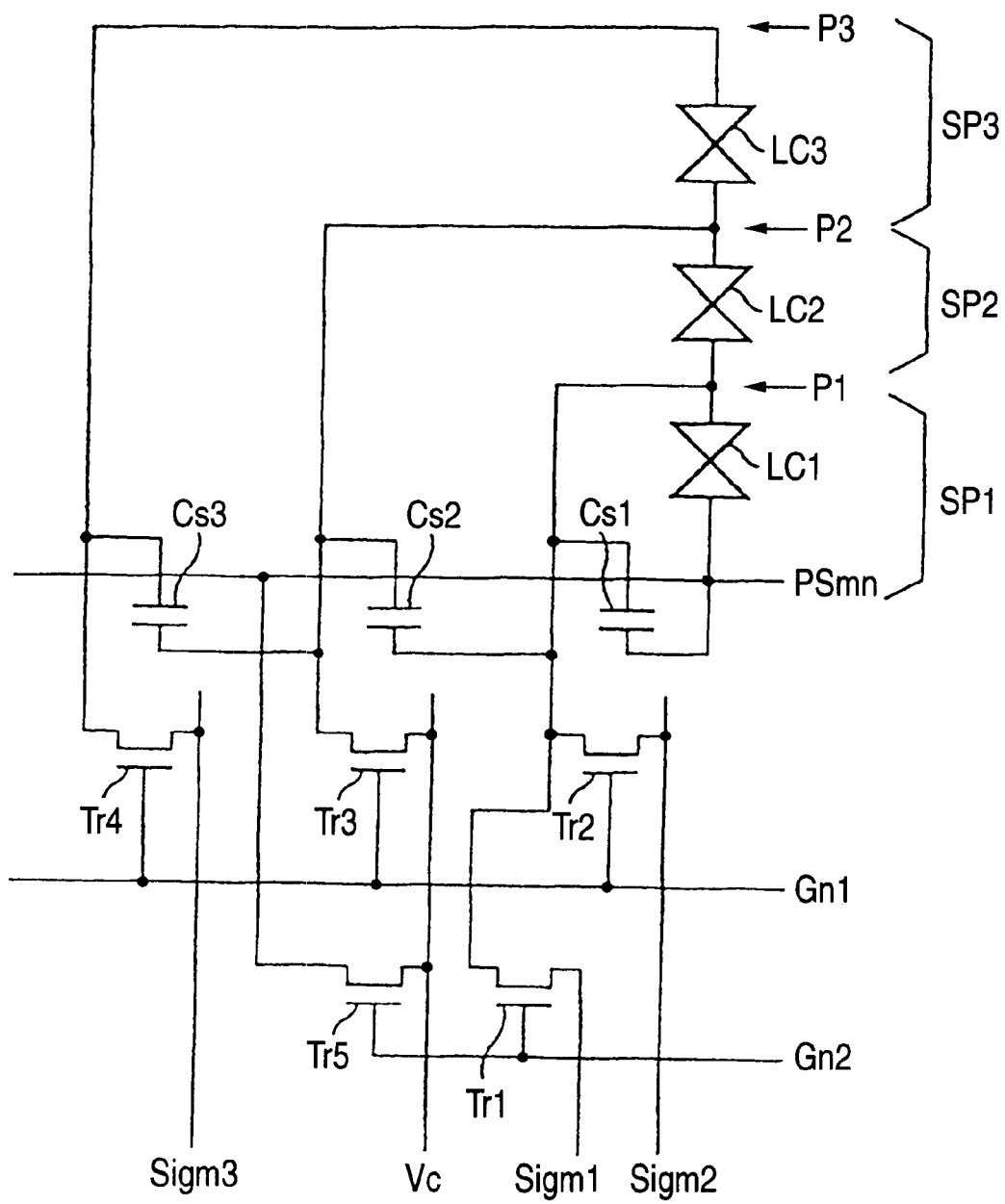
FIG. 23 is an equivalent circuit diagram of a pixel portion according to the fourth embodiment of the present invention.

FIG. 23 shows one pixel portion according to this embodiment of the present invention. First, to drive the sub-pixels SP2 and SP3, a common potential is supplied from the Vc line to the pixel electrode P2 and, at the same time, prescribed signal potentials are supplied from the signal line Sigm2 and Sigm3 to the pixel electrodes P1 and P3 via the TFTs Tr2 and Tr4. Subsequently, the pixel electrodes P2 and P3 are rendered in a floating state and, at the same time, the common potential is supplied from the Vc line to the shield electrode PSmn (also functions as a pixel electrode) and a prescribed signal potential is supplied from the signal line Sigm1 to the pixel electrode P1. At this time, because of the presence of the shield electrode PSmn which covers most of the pixel, the states of the sub-pixels SP2 and SP3 can vary from the states in which they hold the potentials applied thereto. In this embodiment of the present invention, the shield electrodes PSmn of all pixels are integrated to become a common electrode.

Figure 24:
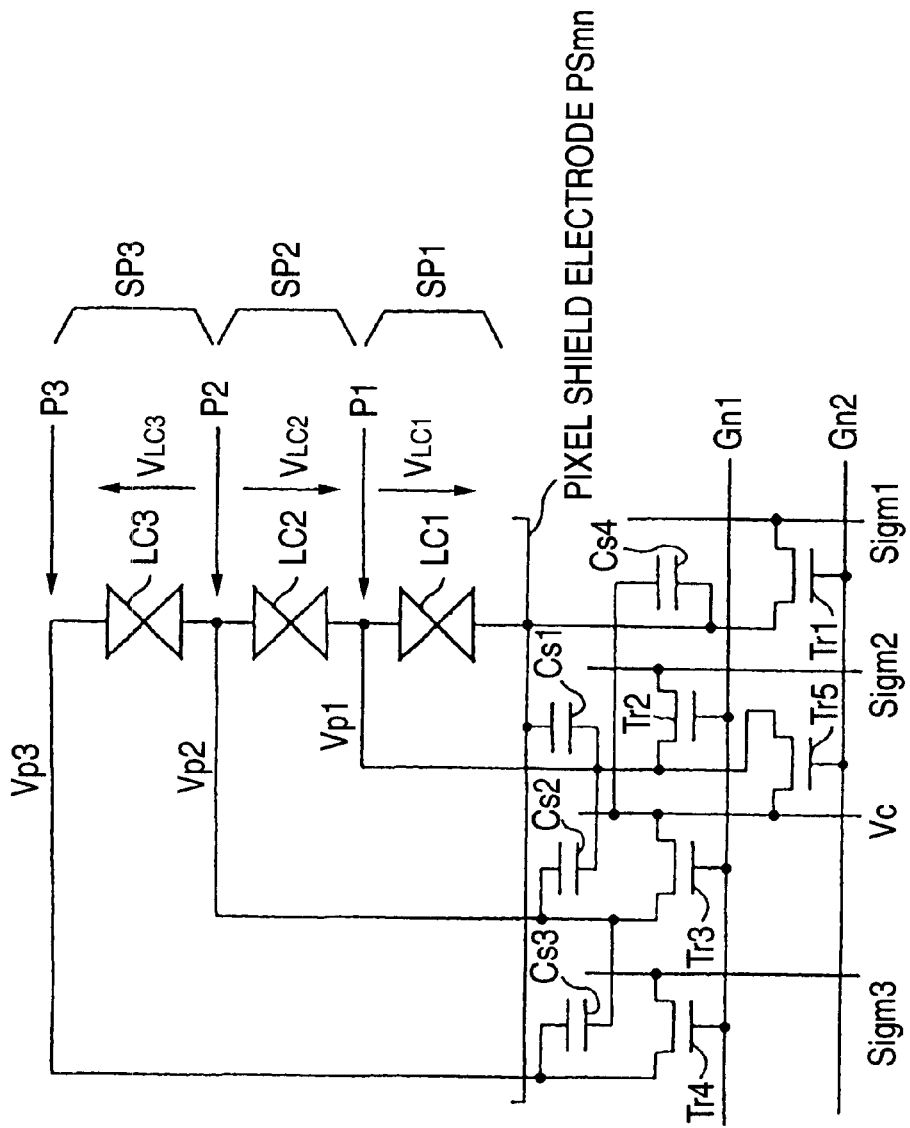
FIG. 24 is an equivalent circuit diagram of another example of a pixel portion according to the fourth embodiment of the present invention.

FIG. 24 shows another example of a pixel portion according to this embodiment of the present invention. First, to drive the sub-pixels SP2 and SP3, a common potential Vc is supplied to the pixel electrode P2 and, at the same time, prescribed signal potentials are supplied from the signal lines Sigm2 and Sigm3 to the pixel electrodes P1 and P3 via the TFTs Tr2 and Tr4. Subsequently, the pixel electrodes P2 and P3 are rendered in a floating state and, at the same time, a prescribed signal potential is supplied from the signal line Sigm1 to the shield electrode PSmn and the common potential is supplied from the Vc line to the pixel electrode P1. The shield electrode PSmn also functions as a pixel electrode. At this time, because of the presence of the shield electrode PSmn which covers most of the pixel, the states of the sub-pixels SP2 and SP3 can vary from the states in which they hold the potentials applied thereto.

Although in the examples of FIGS. 23 and 24 each of the auxiliary capacitors Cs1–Cs3 is provided between adjacent pixel electrodes, the pixel electrodes P1–P3 may form capacitors with the shield electrode PSmn so as to include parasitic capacitances. Although in the examples of FIGS. 23 and 24 driving is performed by using two scanning lines for one pixel as in the case of FIG. 6, they can also be applied to the driving in which only one scanning line is used for one pixel as in the case of FIG. 16.

It is possible to cause the shield electrode to function as a reflection plate by forming asperity on its surface. Further, an alternative structure is possible in which a transparent shield electrode is used and a reflection surface, a holographic reflection surface, a white paint surface, or the like is provided under the shield electrode.

Although the first to fourth embodiments of the present invention are directed to the case of using three liquid crystal layers, the above-described concepts can also be applied to the case of using four liquid crystal layers (CMY plus black and white) or even five or more liquid crystal layers. In the case of using four liquid crystal layers, a configuration corresponding to the first embodiment of the present invention, for example, is such that an additional, fourth pixel electrode and a fourth liquid crystal layer are disposed under the opposed electrode to form an additional sub-pixel. Prescribed potential differences are given to the respective sub-pixels by supplying potentials to the first to fourth pixel electrodes. Thereafter, the first to third pixel electrodes are rendered in a floating state and the same potential is supplied to the fourth pixel electrode and the shield electrode, and then a prescribed potential difference is applied to the fourth sub-pixel.

Writing to the pixel electrodes may be performed separately for each sub-pixel in a time-divisional manner. For example, a configuration corresponding to the first embodiment may be such that the potential of the sub-pixel SP2 is determined after determination of the potential of the sub-pixel SP1 and the potential of the sub-pixel SP3 is determined last.

The shield electrode is preferably fixed to the same potential as the second electrode when the sub-pixel SP1 is floating and the sub-pixel SP2 is impressed a signal, and the shield electrode is fixed to the same potential as the third electrode when the sub-pixel SP3 is impressed a signal. In fact, the shield electrode and the third electrode are impressed the same potential as the second electrode at impressing a signal to the sub-pixel SP1. Since the potentials of the third electrode and the second electrode changes similarly at impressing a signal to the sub-pixel 2, the first electrode can change with the shield electrode easily.

Next, a fifth embodiment of the present invention is described. Before making a specific description of the fifth embodiment of the present invention, a description is made of problems that occur when a time-divisional differential driving technique is applied to a reflection/stack-type liquid crystal display panel produced by a conventional manufacturing technique, as well as methods for solving those problems.

First, a problem associated with the juxtaposition of auxiliary capacitor electrodes and a method for solving it is described.

Figure 25:
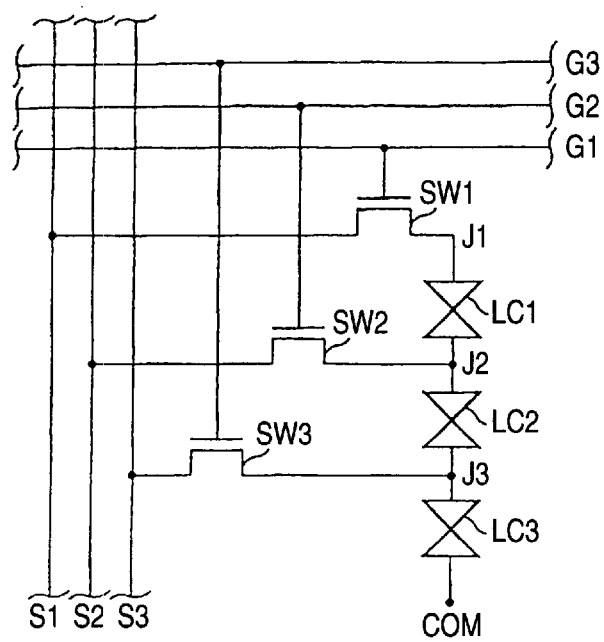
FIG. 25 is an equivalent circuit diagram of a pixel portion of a time-divisional differential driving type liquid crystal display panel.

FIG. 25 shows an example of an equivalent circuit of one pixel of a three-layer-stacked liquid crystal display panel that is subjected to time-divisional differential driving. In FIG. 25, LC1–LC3 denote liquid crystal layers, SW1–SW3 denote driving elements, G1–G3 denote gate signal lines, and S1–S3 denote image signal lines. COM denotes an opposed electrode, and J1–J3 denote the voltage supply points of the driving element.

Figure 26:
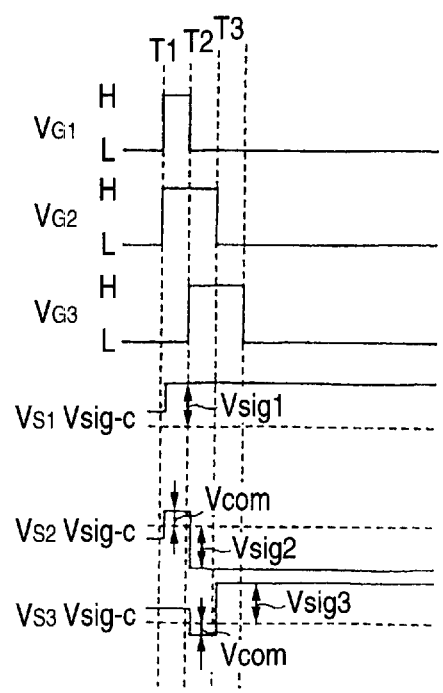
FIG. 26 shows drive waveforms at respective members in time-divisional differential driving.

The time-divisional differential driving is performed according to a timing chart shown in FIG. 26. First, in period T1, the potentials of the gate signal lines G1 and G2 are set at a H state, whereby the driving elements SW1 and SW2 are turned on. In this period, a pixel potential for LC1 is given to the image signal line S1. In the following description, the pixel potential for LC1 means a potential that deviates from a signal reference potential Vsig-c by an image potential Vsig1. A prescribed potential difference is applied to the liquid crystal layer LC 1 by setting the potential of the image signal line S2 at a common potential. In the following description, the common potential means a potential that is deviated from the signal reference potential Vsig-c by an opposed electrode potential Vcom.

After a lapse of period T1, the potential of only the gate signal line G1 is returned to a L state, whereby the driving element SW1 is turned off and the liquid crystal layer LC1 is rendered in a floating state. In this state, the potential difference across the liquid crystal layer LC1 is held even if the potential on the driving element SW2 side varies. In period T2 which starts immediately after period T1, the potential of the gate signal line G3, in addition to the potential of the gate signal line G2, is set at a H state, whereby the driving elements SW2 and SW3 are turned on. In this period, a prescribed potential difference is given to the liquid crystal layer LC2 by switching the potential of the image signal line S2 to a pixel potential for LC2 and setting the potential of the image signal line S3 at the common potential.

After a lapse of period T2, the potential of the gate signal line G2 is returned to a L state, whereby the liquid crystal layer LC2 is also rendered in a floating state. As a result, the potential differences across the respective liquid crystal layers LC1 and LC2 are maintained. In period T3 which starts immediately after period T2, the potential of the image signal line S3 is switched to a pixel potential for LC3 while the potential of the gate signal line G3 is kept at the H state, whereby a prescribed potential difference is given to the liquid crystal layer LC3 (i.e., between the image signal line S3 and the opposed electrode). After a lapse of period T3, the potential of the gate signal line G3 is returned to a L state, whereby potential setting of one pixel is completed.

Although in FIG. 26 the waveforms of the signals for S1–S3 are such that the polarity with respect to the reference potential is inverted for adjacent layers, selection can be made from various kinds of polarity relationships between the layers.

Figure 27:
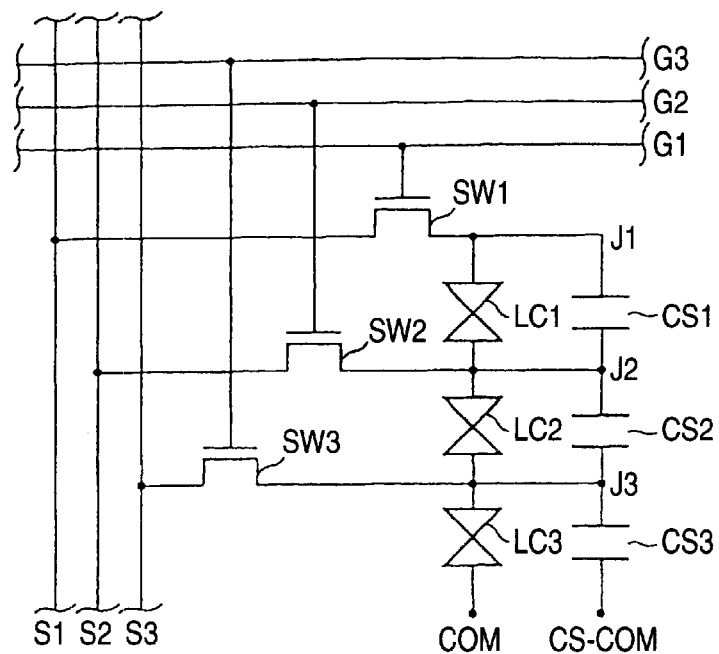
FIG. 27 is an equivalent circuit diagram of a pixel portion according to a fifth embodiment of the present invention.

In the above driving method, to provide auxiliary capacitors for compensating for the potential difference holding characteristic of the liquid crystal layers, the auxiliary capacitors CS1–CS3 are provided in series with each other and in parallel with the corresponding liquid crystal layers LC1–LC3, respectively, as shown in FIG. 27.

Figure 28:
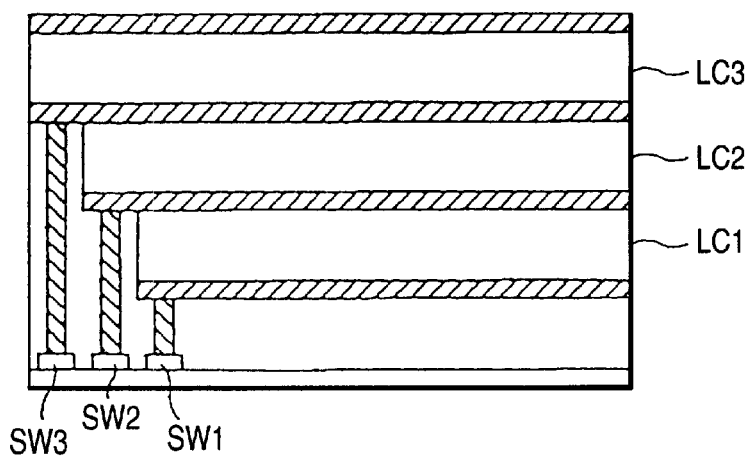
FIG. 28 is a sectional view of a stack-type liquid crystal display panel.

On the other hand, in the three-layer-stacked reflection-type liquid crystal display panel, it is desirable that the driving elements and the signal lines be formed together right under the reflection electrode. This is to secure a sufficient display area and reduce the manufacturing cost. In this case, to apply drive voltages to the respective liquid crystal layers, vertical conductors are provided beside each pixel region as shown in FIG. 28.

Figure 29:
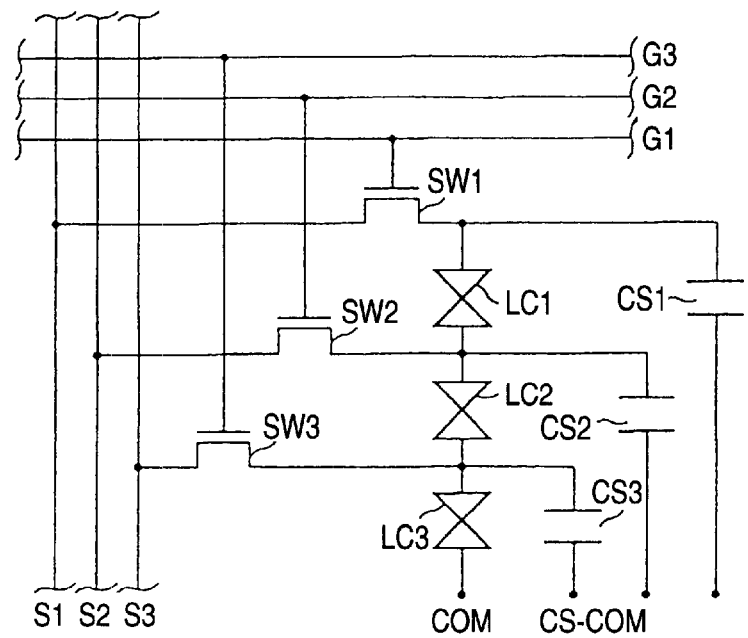
FIG. 29 is an equivalent circuit diagram of the stack-type liquid crystal display panel.

A manufacturing process for the conventional configuration is as follows. First, image signal lines, voltage supply pads for vertical conductors, and auxiliary capacitor electrodes connected to those pads are patterned in the same plane by a single process. Then, capacitors are formed by the above electrodes and electrodes which are patterned as an extension of gate or signal lines. FIG. 29 is an equivalent circuit diagram of this configuration and is different from the equivalent circuit diagram of FIG. 27. In this circuit configuration, the liquid crystal layers LC1 and LC2 are never rendered in a floating state. In the configuration of FIG. 29, the potential of an auxiliary capacitor opposed electrode CS-COM is the same as that for one of the above gate or signal lines. However, the above situation remains the same even if auxiliary capacitor opposed electrodes for the respective layers are formed independently of each other, unless they are disconnected to above gate or signal lines. That is, there is a problem that time-divisional differential driving cannot be realized by a structure in which auxiliary capacitor electrodes are simply juxtaposed with each other.

Figure 30:
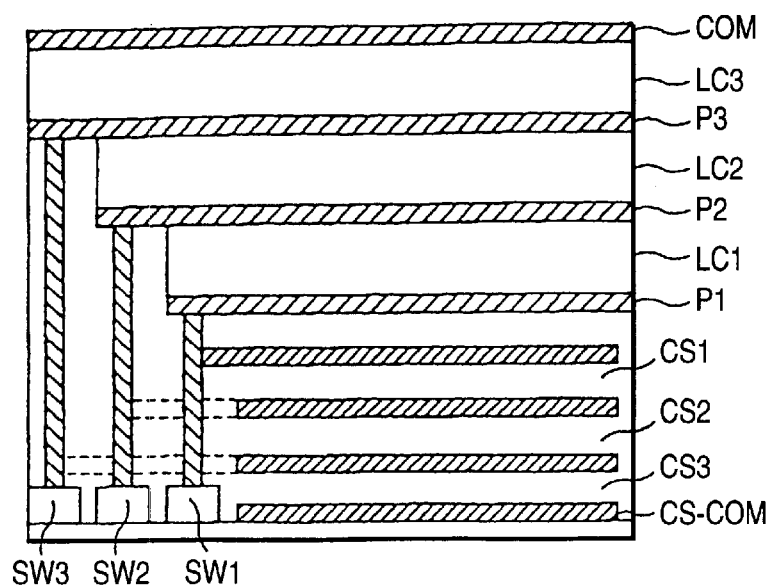
FIG. 30 is a sectional view of a stack-type liquid crystal display panel according to the fifth embodiment of the present invention.

To solve the above problem, this embodiment of the present invention employs a structure in which auxiliary capacitor electrodes are laid one on another. In the manufacture of this structure, the number of steps for patterning auxiliary capacitor electrodes is increased from the number in the conventional manufacturing method. The increase in the number of steps can be minimized by laminating only two electrodes that are to be connected to the SW2 voltage supply point (J2 in FIG. 27) and the SW3 voltage supply point (J3 in FIG. 27) when the associated electrodes are rendered in a floating state. In this case, the other electrode for forming the auxiliary capacitor CS1 also serves as a display electrode (reflective electrode) of the liquid crystal layer LC1. However, in many cases, asperity is formed on an electrode for controlling the reflective characteristic. In such a case, a spatial variation of the interelectrode distance makes it difficult to determine the capacitance value. Therefore, it is desirable to form also the auxiliary capacitor CS1 separately. FIG. 30 is a sectional view showing such a configuration conceptually. Eventually, the equivalent circuit of FIG. 27 can be realized with the minimum number of additional steps when the auxiliary capacitor electrodes are disposed in the order that is opposite to the stack order of the corresponding pixel electrodes.

Next, a problem associated with the in-plane layout of auxiliary capacitors and a method for solving it is described.

Usually, from the viewpoint of the voltage holding function, that is, from the viewpoint of securing sufficiently large auxiliary capacitance values, it is sufficient to form auxiliary capacitor electrodes only in regions right under parts of a reflective electrode. However, in this structure, non-negligible capacitances are caused by the reflective electrode and conductors (signal lines, electrodes, vertical conductors) provided right under the reflective electrode. Those capacitances causes the potential of the reflective electrode to be varied through capacitive coupling at every potential variation during scanning periods. In particular, because the potentials of the signal lines are switched plural times for one pixel, the rate of occurrence of potential variations is higher in time-divisional differential driving than in the conventional driving.

In the present invention, to inhibit potential variations, the auxiliary capacitor electrodes are made as wide as possible. In this case, because of the potential shield effect of a planar electrode, the coupling between electrodes above and below each auxiliary capacitor electrode becomes very small. In particular, it is effective to dispose the electrode connected to the J1 point between the reflective electrode and the electrode connected to the J2 point with an intention to obtain a pure shield effect. It is preferable to increase the stacked electrode area in order of the electrode connected to the J3 point, the electrode connected to the J2 point, and the electrode connected to the J1 point. Alternatively, the stacked electrode area may be increased in order of the electrode connected to the J3 point, the electrode connected to the J2 point, and the reflective electrode. It is also desirable to employ a plan layout in which related wiring lines are covered with each auxiliary capacitor electrode as much as possible. Even if the electrode areas are made different so as to have a particular ratio, arbitrary capacitance values can be obtained by adjusting the electrode interval or the relative permittivity of an insulating layer provided between the electrodes.

Figure 31:
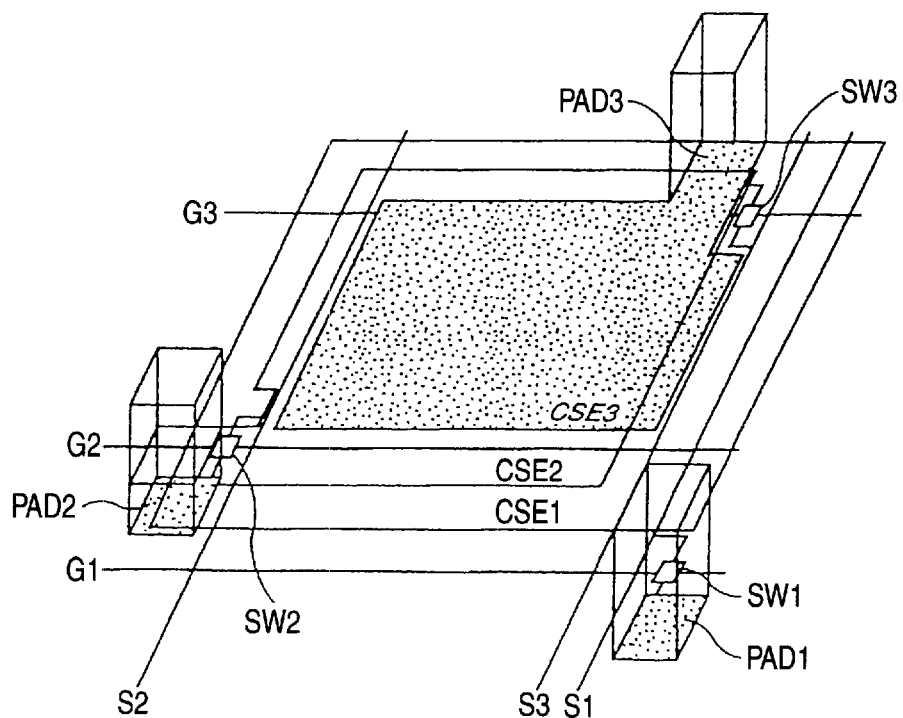
FIG. 31 is a perspective view showing a plan layout according to the fifth embodiment of the present invention.

If the efficiency of covering of wiring lines by the auxiliary capacitor electrodes is taken into consideration, that is, if the fact that a lower auxiliary capacitor electrode can cover a smaller number of signal electrodes is taken into consideration, it is desirable to form the image signal line S3 for the highest liquid crystal layer inside and the image signal lines S1 and S2 for lower liquid crystal layers outside. FIG. 31 is a perspective view showing an example plan layout of auxiliary capacitor electrodes and signal lines that satisfies the above conditions. Electrodes that are disposed right above driving elements at the same height as image signal lines are dotted in FIG. 31. CSE1–CSE3 denote auxiliary capacitor electrodes. The auxiliary capacitor electrode CSE1 may also serve as a reflective pixel electrode for the lowest LC layer. However, when the bottom surface of a reflective electrode is formed with asperity (e.g., it is embossed), it is desirable to provide a reflective pixel electrode for the lowest LC layer separately from the auxiliary capacitor electrode CSE1. An electrode opposed to auxiliary capacitor, which is disposed at the same height as or below gate lines, is omitted in FIG. 31. PAD1–PAD3 denote voltage supply pads for connection to vertical conductors. If the voltage supply pads PAD1–PAD3 are disposed in the vicinity of driving element voltage supply portions, the loss of voltage supply to pixel electrodes located above is made small.

Figure 32:
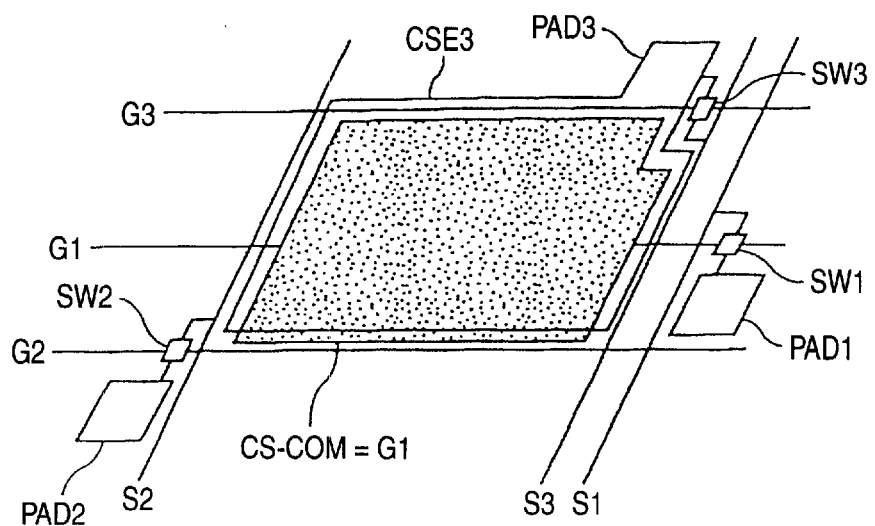
FIG. 32 is a perspective view showing another plan layout according to the fifth embodiment of the present invention.

If a layout in which the gate line G1 for the lowest liquid crystal layer is disposed inside and the gate lines G2 and G3 for higher liquid crystal layers are disposed outside is combined with time-divisional differential driving, the gate line for the lowest layer can also serve as an auxiliary capacitor opposed electrode. This is because waveforms can be set so that the H-state period for the lowest layer does not overlap with the H-state period for the highest layer as shown in FIG. 26. This structure further simplifies the configurations of peripheral circuits. FIG. 32 is a perspective view showing an example plan layout of auxiliary capacitor electrodes and gate lines for the two lower layers that satisfy the above conditions. An auxiliary capacitor opposed electrode CS-COM that is located at the same height as the gate lines is dotted in FIG. 32.

Examples of the material for forming the auxiliary capacitor electrodes that can be used in this embodiment of the present invention are metals such as Al, Mo, Cr, Ta, and W and alloys that are combinations of those metals. If it is intended to give the auxiliary capacitor electrode CSE1 only a function of electrical shielding against influences from lower surfaces, it may also be made of an organic conductive material.

It is desirable that the interlayer insulating layer that constitutes the auxiliary capacitors be made of a material that provides a good contact with the driving elements. In particular, when the driving elements are Si transistors, a nitride (SiNx) and an oxide (SiOx) are generally used for this purpose. When a higher level of dielectric performance (that is an electric field concentration effect) is required, an oxide of Ta or Ti is used. When a low level of dielectric performance (that is, an electric field shield effect) is required, organic materials are used.

Examples of the liquid crystal material are liquid crystals with phenyl fluoride group, cyano biphenyl liquid crystals, and liquid crystals with ester bond. Since display is performed in a mode in which light is absorbed when no potential is applied, dielectric anisotropy are desirable.

Examples of the dichroic dye molecule are yellow dyes having the following chemical formulae (1)–(9), magenta dyes having the following chemical formulae (10)–(17), and cyan dyes having the following chemical formulae (18)–(21):

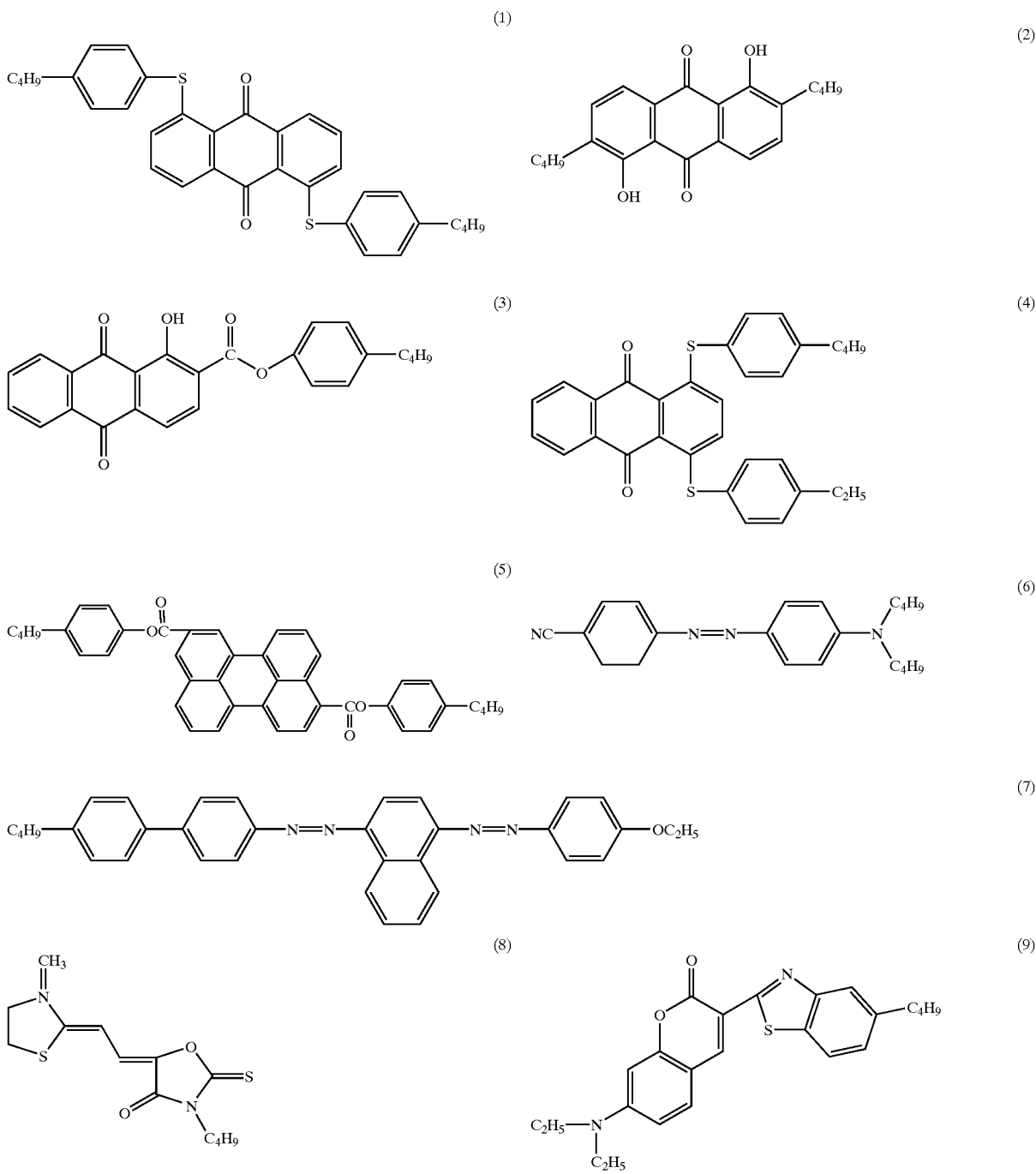

-continued
(10)
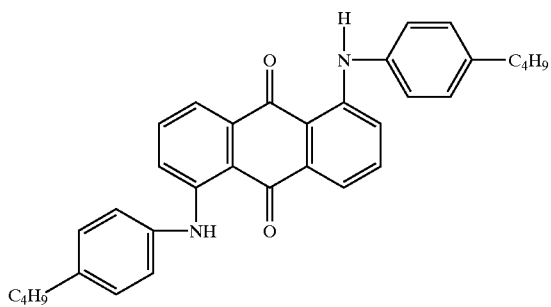
(11)
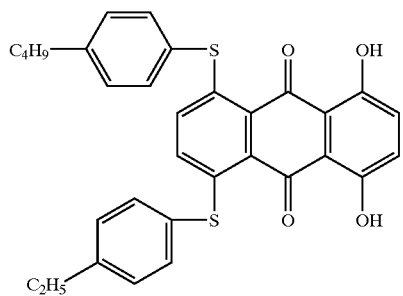
(12)
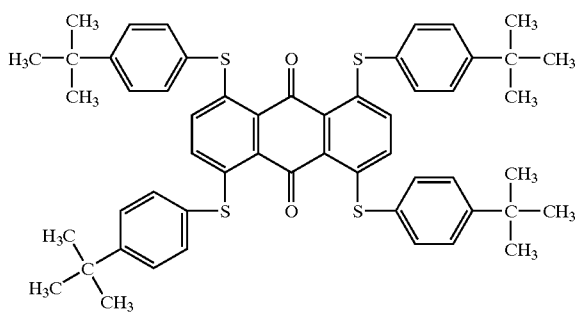
(13)
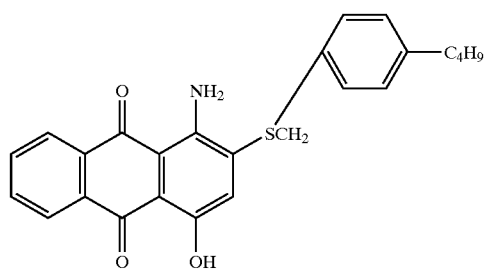
(14)
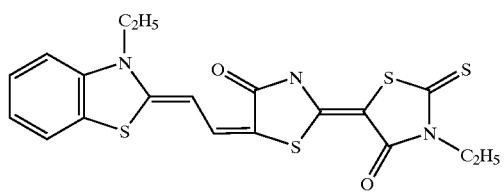
(15)
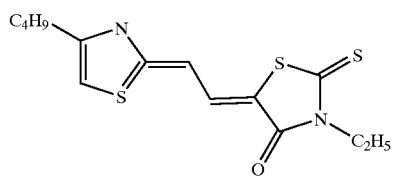
(16)
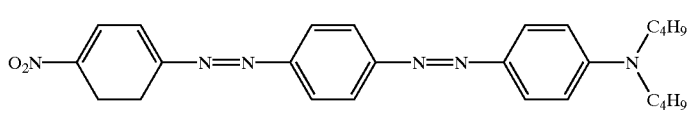
(17)
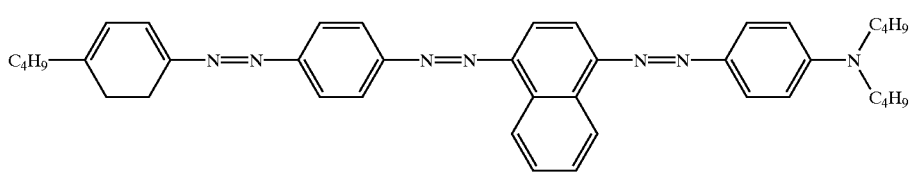
(18)
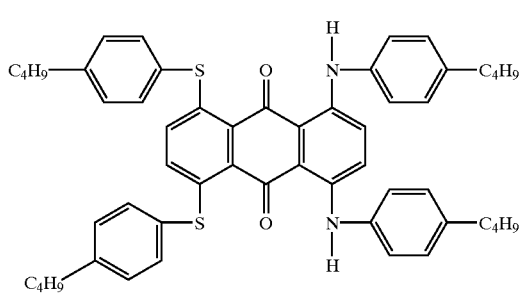
(19)
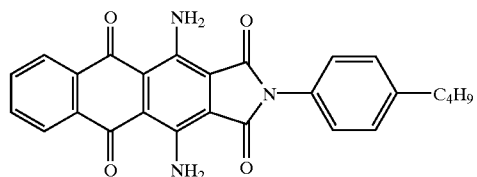

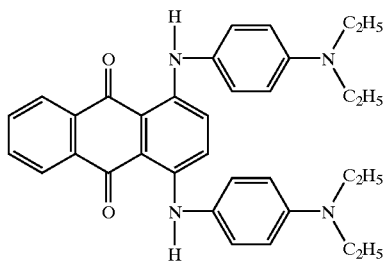

(20)

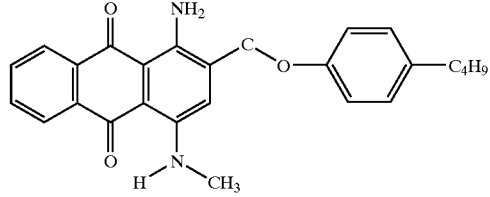

(21)

The concentration of the dichroic dye to the liquid crystal material is 0.01–10%, preferably 0.1–5%. If the concentration is too small, the contrast is not sufficiently high. If the concentration is too large, coloration remains even during potential application, and hence the contrast ratio is not sufficiently high either.

Examples of the binder resin are thermoplastic resins including ethylene polymers; ethylene chloride polymers; ethylene copolymers such as an ethylene-vinyl acetate copolymer and an ethyl acrylate maleic anhydride copolymer; butadiene polymers; polyesters such as polyethylene terephthalate, polybutylene terephthalate, and polyethylene naphthalate; propylene polymers; isobutylene polymers; vinyl chloride polymers; vinylidene chloride polymers; vinyl acetate polymers; vinyl alcohol polymers; vinyl acetal polymers; vinyl butyral polymers; homopolymer of tetrafluoroethylene; homopolymer of trifluoroethylene; fluoroethylene propylene copolymers; vinylidene fluoride polymers; vinyl fluoride polymers; tetrafluoroethylene copolymers such as perfluoroalkoxy tetrafluoroethylene copolymers, or tetrafluoroethylene perfluorovinyl ether copolymers, a tetrafluoroethylene hexafluoropropylene copolymer, and tetrafluoroethylene copolymers; fluorinated polymers such as fluorinated polybenzoxazole and fluororinated polybenzothiazoles; acrylic acid polymers; methacrylic acid polymers such as polymethyl methacrylate; acrylonitrile polymers; acrylonitrile copolymers such as an acrylonitrile-butadiene-stylene copolymers; stylene polymers; stylene halogenide polymers; stylene copolymers such as a stylene-methacrylic acid copolymers and a stylene-acrylonitrile copolymers; ionic polymers such as sodium polystylenesulfonate and sodium polyacrylate; acetal polymers; polyamides such as nylon 66; gelatins; industrial gums; polycarbonates; ester-carbonate copolymers; cellulose polymers; phenolic polymers; polyureas; epoxy polymers; unsaturated polyesters; alkyd polymers; melamine copolymers; polyurethanes; diaryl phthalate polymers; polyphenylene ethers; polyphenylene sulfides; polysulfones; polyphenyl sulfones; silicone polymers; polyimides; bismaleimide triazine polymers; polyimideamides; polyethersulfones; 4-methyl-1-pentene polymers; polyetheretherketones; polyetherimides; polyvinyl carbazoles; and norbornene-type amorphous polyolefins.

Examples of the liquid crystal encapsulation technique are an interracial polymerization method, an in-situ polymerization method, a coacervation method, a method with phase separation from an aqueous or an organic solution system, a method with devolatilization from an emulsion, Wurster air suspension method, and a spray drying method. Selection can be made properly from those methods in accordance with the display mode, or shape, of a liquid crystal display device. Examples of the capsule are thermosetting resins including condensation polymers such as melamine polymers, epoxy polymers, urea polymers, phenolic polymers, and furan polymers, and three-dimensional cross-linking vinyl polymers such as stylene-divinylbenzene copolymers and methyl methacrylate-vinyl acrylate copolymers; and the thermoplastic resins that have been disclosed above as the examples of the binder resin. Further, liquid crystal may be encapsulated by forming a multi-layer capsule by using two or more resins that are selected from the above thermosetting resins and thermoplastic resins. In this case, to improve the heat stability of microcapsules, it is preferable to use a thermosetting resin as the outermost layer.

Next, a sixth embodiment of the present invention is described.

An anthraquinone-type yellow dichroic dye having the following structural formula (22) was dissolved in a liquid crystal mixture Lixon-5035XX (product name; produced by Chisso Corporation).

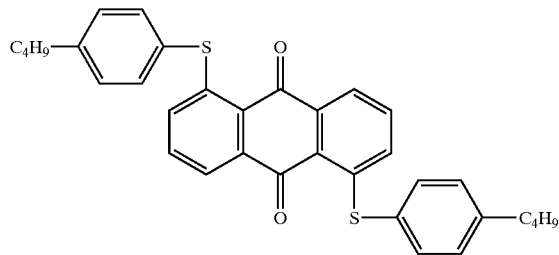

(22)

Monomers, that is, a methyl methacrylate monomer of 3 wt % and an octadecyl methacrylate monomer of 12 wt %, and divinylbenzene of 1 wt % as a crosslinking agent were mixed into and dissolved in the above liquid crystal mixture of 84 wt %. By using an emulsification apparatus (produced by Ise Chemicals Corp.), an emulsion was obtained by causing a resulting mixed liquid to pass through a hydrophilic porous glass tube having an average hole diameter of 1 $\mu$m and squeezing it out of the tube into a flow of a 0.3 wt % aqueous solution of polyvinyl alcohol by applying hydrostatic pressure of 1.5 atm to the liquid. The emulsion that is a liquid crystal composition was polymerized at 85° C. for 1 hour while being stirred at 50 rpm, and then refined by causing it to pass through, together with pure water, a porous tube that is made of an ion-exchangable resin. The shape of resulting encapsulated liquid crystal containing the yellow dye was observed with a optical microscope; they were spherical and had an average diameter of 6 $\mu$m.

Encapsulated liquid crystal containing a magenta dye was produced by a similar process, using an anthraquinone-type magenta dichroic dye having the following structural formula (23):

(23)

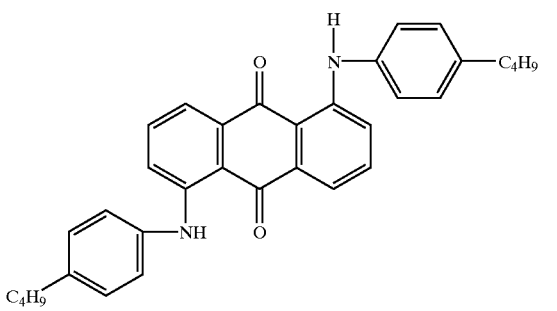

Encapsulated liquid crystal containing a cyan dye was produced by a similar process, using an anthraquinone-type cyan dichroic dye having the following structural formula (24):

(24)

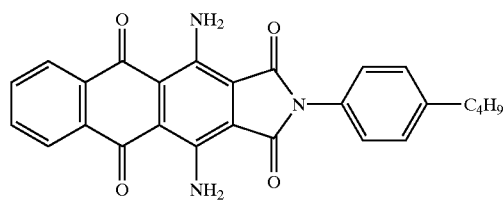

Figure 33:
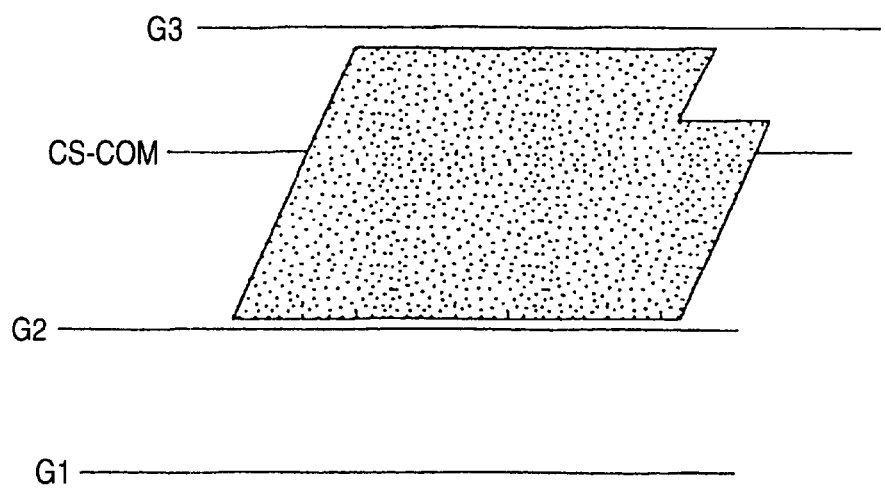
FIGS. 33–38 show a manufacturing process according to a sixth embodiment of the present invention.

A Mo–Ta alloy was deposited, at a thickness of about 250 nm, on a glass substrate of about 0.7 mm in thickness and then patterned to form gate electrodes (three systems for one pixel) and an electrode opposed to auxiliary capacitor in a layout shown in FIG. 33.

Figure 34:
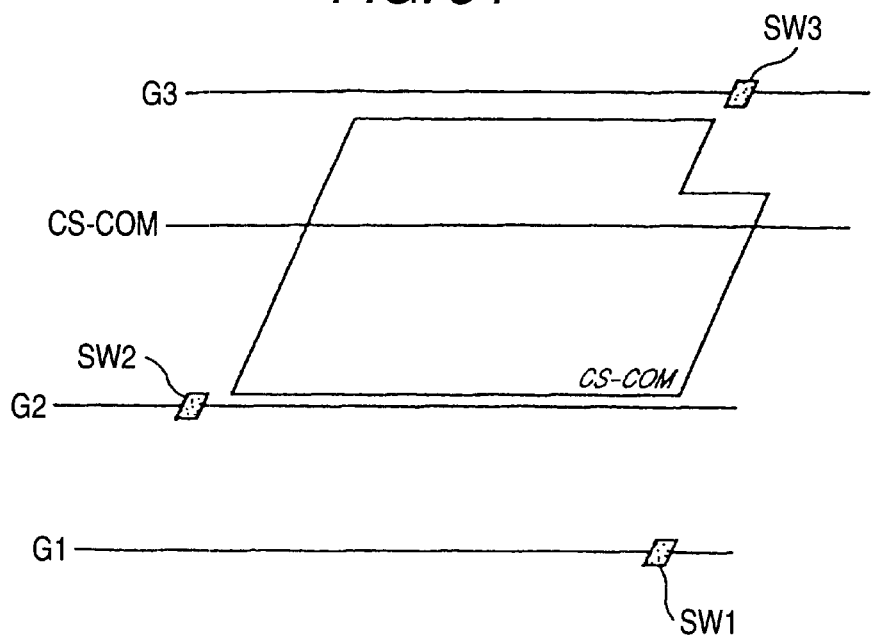

After a gate insulating layer was formed by depositing SiOx at a thickness of about 300 nm and SiNx at a thickness of about 50 nm, a-Si (for a channel layer) and SiNx (for a channel protective layer) were deposited consecutively at respective thicknesses of about 50 nm and about 200 nm. After the channel protective layer was etched into island-like shapes, an ohmic contact layer was formed by depositing n+a-Si at a thickness of about 50 nm and then the a-Si layer and the n+a-Si layer were etched into island-like shapes, whereby channels (three systems for one pixel) were formed at positions shown in FIG. 34. Then, gate electrode lead-out portions of the gate insulating layer were removed.

Figure 35:
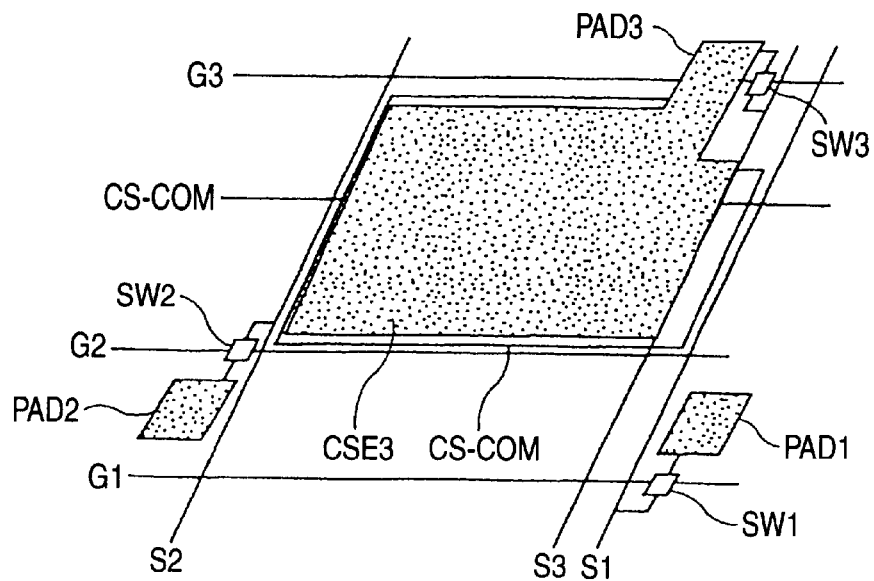

Subsequently, Cr and Al were deposited at respective thicknesses of about 50 nm and about 300 nm and then patterned, whereby drain electrodes connected to respective three-system signal electrodes were formed on one side of the respective channels. A first-system connection pad electrode connected to a first-system source electrode was formed on the other side of the first-system channel. A second-system connection pad electrode connected to a second-system source electrode was formed on the other side of the second-system channel. A third-system vertical conductor connection pad electrode connected to a third-system source electrode was formed on the other side of the third-system channel. A third-system auxiliary capacitor electrode was also formed (see FIG. 35).

Figure 36:
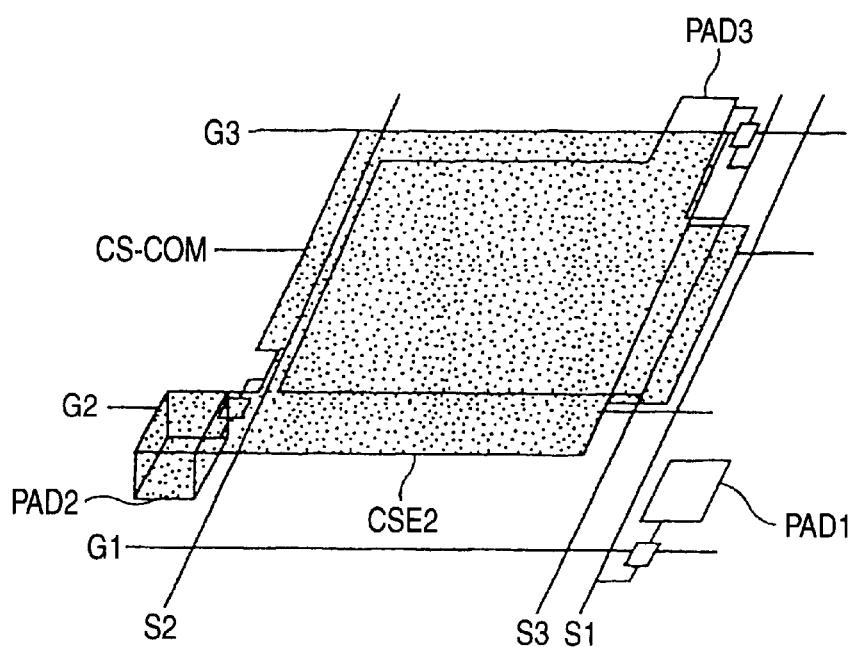

The portions of the n+a-Si layer between the source and drain electrodes were removed by etching selectively with respect to the channel protective layer with the signal electrodes used as masks. After SiNx was deposited at a thickness of about 300 nm, the portions of the SiNx film above the first and second-system connection pad electrodes, the third-system vertical conductor connection pad electrode, end pad electrodes of matrix electrodes, and the source electrodes were removed by etching. Thereafter, Mo was deposited at a thickness of about 300 nm and then patterned, whereby a second-system vertical conductor connection pad electrode and a second-system auxiliary capacitor electrode were formed so as to be connected to the second-system connection pad electrode (see FIG. 36).

Figure 37:
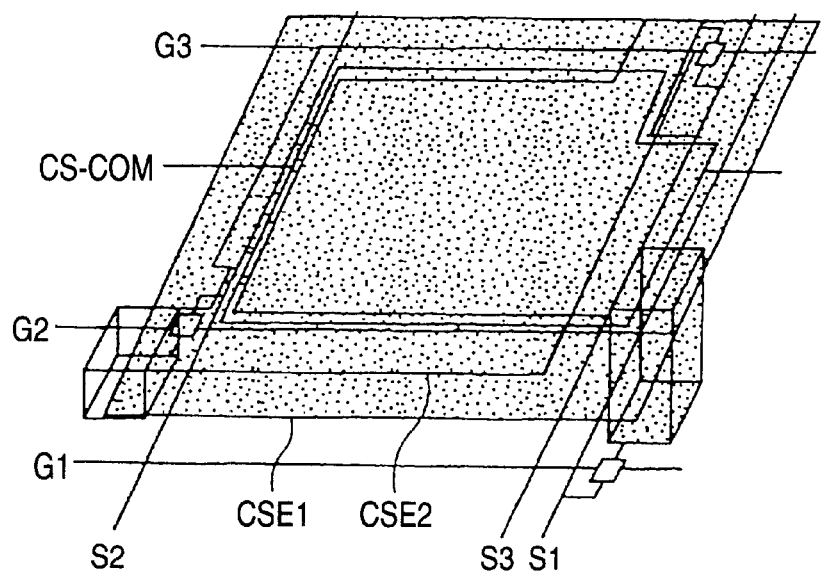

Then, after SiNx was deposited at a thickness of about 400 nm, the portions of the SiNx film on the first-system connection pad electrode, the second and third-system vertical conductor connection pad electrodes, the end pad electrodes of the matrix electrodes, and the source electrodes were removed by etching. Further, Mo was deposited at a thickness of about 300 nm and then patterned, whereby a first-system vertical conductor connection pad electrode and a first-system auxiliary capacitor electrode were formed so as to be connected to the first-system connection pad electrode (see FIG. 37).

Thereafter, SiNx was deposited at a thickness of about 200 nm, and its portions on the first to third-system vertical conductor connection pad electrodes, the peripheral pad electrodes, and the source electrodes were removed by etching. An undercoat layer for reflective electrode was formed by coating polyimide on the SiNx layer at a thickness of about 1 µm, and its portions on the first to third-system vertical conductor connection pad electrodes were removed by etching. After the surface of the polyimide film was subjected to dimple formation by mold thrusting, Al was deposited at a thickness of about 200 nm and patterned into a reflective pixel electrode.

Then, the first-system vertical conductor connection pad electrode was connected to the reflective pixel electrode with a hydrophobic conductive paste. At the same time, a first electrode pole of about 10 µm in height and a second electrode pole of about 22 µm in height were formed on the second and third-system vertical conductor connection pad electrodes, respectively.

A yellow light modulation layer was formed by coating the encapsulated liquid crystal containing yellow dye and binder resins to the above structure by screen printing.

The above second-layer film was coated with a protective film that is an aqueous solution of hydroxymethylethyl cellulose, which had affinity for the encapsulated liquid crystal film but had no affinity for the electrode poles. The aqueous solution was dried at about 120° C., which is lower than the glass transition temperature of the capsule material. It is preferable that the contact angle between the protective film and the encapsulated liquid crystal film be smaller than 5° and that the contact angle between the protective film and the electrode poles be larger than 50°.

Then, all the laminated films were subjected to annealing in an air atmosphere, whereby the surface of the protective film was rendered hydrophobic and the adhesion between the liquid crystal microcapsules and the substrate was increased. A toluene solution of polyester, for example, as a hydrophobic ITO filler dispersion liquid, which had affinity for both of the protective film and the electrode poles, was applied to the above structure selectively, that is, in electrode shapes. The solution was dried at ordinary temperature in a nitrogen atmosphere, and then illuminated with ultraviolet light having a center wavelength 147 nm to both set it and render it conductive. As a result, electrical connection between a resulting film and the top portion of the first electrode pole was secured.

Subsequently, steps similar to the above were performed, whereby a cyan light modulation layer that was constituted of encapsulated liquid crystal containing a cyan dye, and a protective film were formed sequentially. Annealing was then performed in an air atmosphere, whereby the entire surface of the protective film was rendered hydrophobic and the adhesion between the liquid crystal microcapsules and the substrate was increased. A toluene solution of polyester, for example, as a hydrophobic ITO filler dispersion liquid, which had affinity for both of the protective film and the electrode poles, was applied to the above structure selectively, that is, in electrode shapes. The solution was dried at ordinary temperature in a nitrogen atmosphere, and then illuminated with ultraviolet light having a center wavelength 147 nm to both set it and render it conductive. As a result, electrical connection between a resulting film and the top portion of the second electrode pole was secured.

Subsequently, a magenta light modulation layer that is constituted of encapsulated liquid crystal containing a magenta dye, and a protective film were formed sequentially by similar steps. Finally, a glass substrate formed with a transparent electrode was heated and pressure-bonded to the top portion of the above structure, whereby a three-layer stack-type liquid crystal display panel having a sectional structure as shown in FIG. 30 was obtained.

When pixel portions of this liquid crystal display panel was observed with a microscope, capsules were not damaged at all and liquid crystal molecules were aligned approximately parallel to the substrate with no alignment defects. Having no intermediate substrates, this liquid crystal display panel was free of parallax due to a stack structure. When driver ICs were mounted by TAB and AC voltages having a maximum signal amplitude 5 V were applied between the three layers independently according to the timing chart shown in FIG. 26, 6-bit color display with a monochromatic contrast ratio of 5:1 and good hue performance was obtained.

In a seventh embodiment of the present invention, spherical liquid crystal microcapsules having an average diameter of about 6 $\mu$m and containing a yellow, magenta, or cyan dye are produced by the same method as in the sixth embodiment of the present invention.

A Mo—Ta alloy is deposited, at a thickness of about 250 nm, on a glass substrate of about 0.7 mm in thickness and then patterned, whereby gate electrodes are formed in three systems for one pixel. At this time, the first-system gate electrode is shaped like the lower layer in FIG. 32 because it is to also serve as an auxiliary capacitor opposed electrode.

A three-layer stack-type liquid crystal display panel having the same sectional structure as in the sixth embodiment of the present invention except that the wiring shapes of the two layers immediately above the glass substrate are as shown in FIG. 32 is produced by the same manufacturing process as in the sixth embodiment of the present invention.

When driver ICs were mounted by TAB, and AC voltages having a maximum signal amplitude 5 V were applied between the three layers independently according to the timing chart shown in FIG. 26, 6-bit color display with a monochromatic contrast ratio of 5:1 and good hue performance was obtained.

Next, an eighth embodiment of the present invention is described.

TFTs of three systems for one pixel and wiring lines therefor are formed in the same manner as in the above.

An undercoat layer for reflective electrode is formed by coating polyimide on the above structure at a thickness of about 1 $\mu$m, and its portions on the first to third-system vertical conductor connection pad electrodes are removed by etching. After the surface of the polyimide film is subjected to dimple formation by mold thrusting, Al is deposited at a thickness of about 200 nm and patterned into a reflective opposed electrode.

A first electrode pole of about 34 $\mu$m in height, a second electrode pole of about 22 $\mu$m in height, and a third electrode pole of about 10 $\mu$m in height are formed on the first to third-system vertical conductor connection pad electrodes, respectively.

A yellow light modulation layer that is constituted of liquid crystal microcapsules containing a yellow dye is formed on the above structure and its electrical connection to the top portion of the third electrode pole is secured by the same steps as in the sixth embodiment. Similarly, a cyan light modulation layer that is constituted of liquid crystal microcapsules containing a cyan dye is formed and its electrical connection to the top portion of the second electrode pole is secured. Similarly, a magenta light modulation layer that is constituted of liquid crystal microcapsules containing a magenta dye is formed and its electrical connection to the top portion of the first electrode pole is secured.

Figure 38:
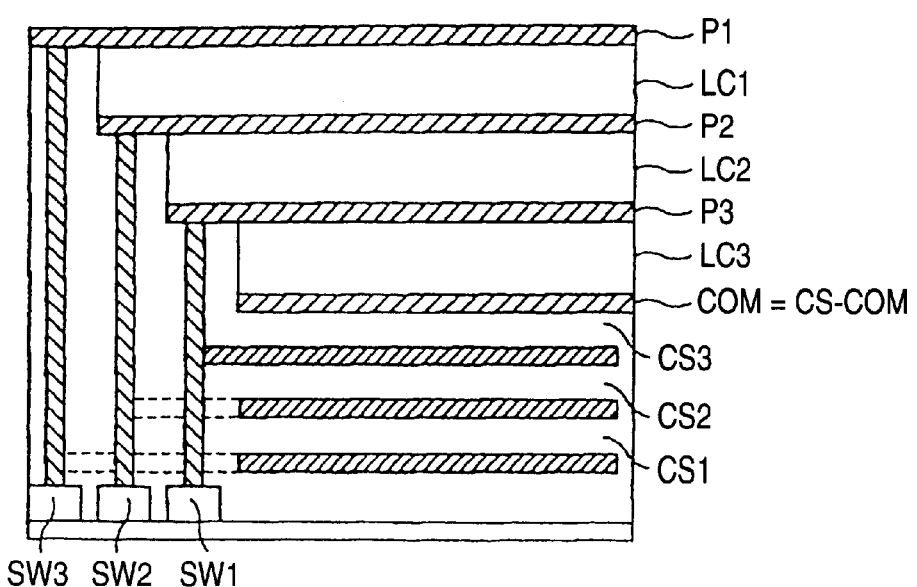

A glass substrate is heated and pressure-bonded to the top portion of the above structure, whereby a three-layer stack-type liquid crystal display panel having a sectional structure as shown in FIG. 38 is obtained. Driver ICs are mounted by TAB. When AC voltages having a maximum signal amplitude 5 V were applied between the three layers independently according to the timing chart shown in FIG. 26, 6-bit color display with a monochromatic contrast ratio of 5:1 and good hue performance was obtained

COMPARATIVE EXAMPLE 1

Spherical liquid crystal microcapsules having an average diameter of about 6 $\mu$m and containing a yellow, magenta, or cyan dye were produced by the same method as in the sixth embodiment of the present invention. A lower substrate having driving elements of three systems was produced in the following manner.

Figure 39:
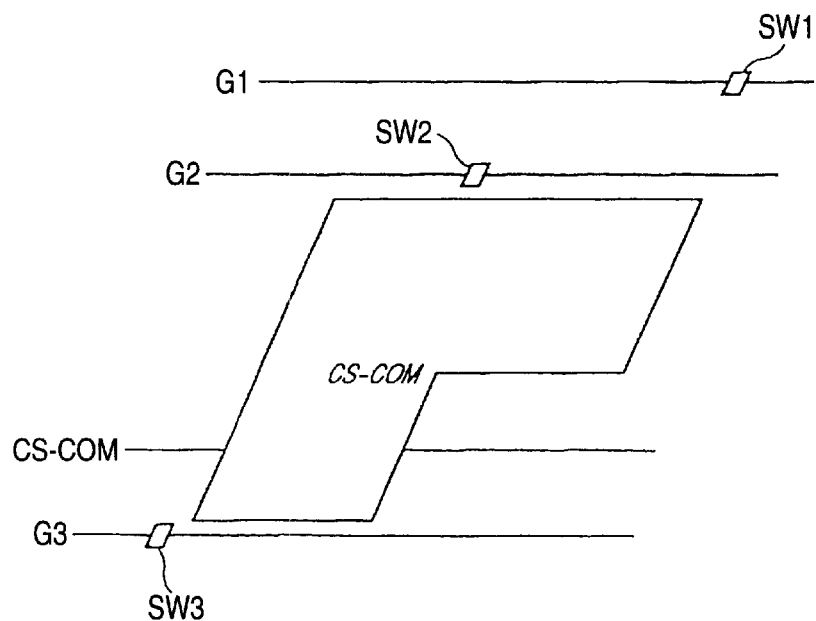
FIG. 39 is a sectional view of a stack-type liquid crystal display panel according to an eighth embodiment of the present invention.

The steps to the three-system channels forming step and the subsequent gate insulating layer removing step were the same as in the sixth embodiment of the present invention. However, a plan layout shown in FIG. 39 was employed for the gate electrodes and the channels.

Figure 40:
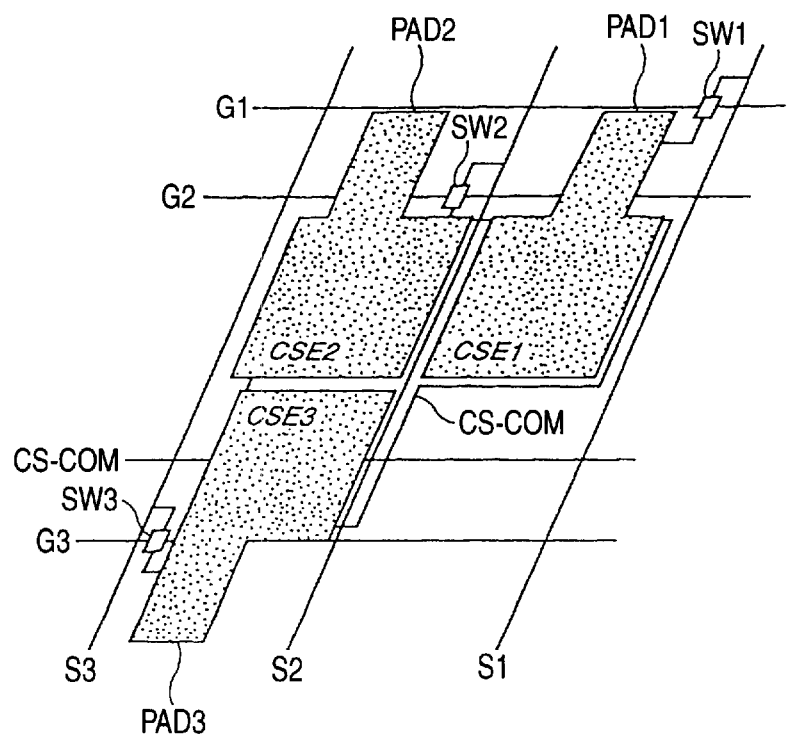
FIG. 40 shows a manufacturing process according to a comparative example.

Cr and Al were deposited at respective thicknesses of 50 nm and 300 nm and then patterned, whereby three-system signal electrodes and drain electrodes connected thereto were formed on one side of the corresponding channels and three-system source electrodes, vertical conductor connection pad electrodes connected thereto and auxiliary capacitor electrodes were formed on the other side of the corresponding channels (see FIG. 40).

The portions of the n+a-Si layer between the sources and the drains were removed by etching selectively with respect to the channel protective layer with the signal electrodes used as masks. SiNx was deposited at a thickness of 200 nm and its portions on the three-system vertical conductor connection pad electrodes, the peripheral pad electrodes, and the source electrodes were removed by etching. An undercoat film for reflective electrode was formed by coating polyimide at a thickness of 2 $\mu$m, and its portions on the three-system vertical conductor connection pad electrodes were removed by etching. After the surface of the polyimide film was subjected to dimple formation by mold thrusting, Al was deposited at a thickness of 200 nm and patterned into a reflective pixel electrode.

Then, to assemble a panel, steps that are the same as in the sixth embodiment of the present invention were executed, whereby a three-layer stack-type liquid crystal display panel having a sectional structure as shown in FIG. 38 was produced.

Driver ICs were mounted by TAB. When AC voltages having a maximum signal amplitude 5 V were applied between the three layers independently according to the timing chart shown in FIG. 26, the color reproduction performance was insufficient. For example, the hue at the time of color display was not constant, that is, it turned yellowish or, conversely, bluish, though a monochromatic contrast ratio of 5:1 was obtained.

Although the present invention has been described above in the form of embodiments, the invention is not limited to those embodiments and various modifications are possible without departing from the spirit and scope of the invention.

According to the present invention, because the manner of the shield electrode connection and the potential application are improved, even if scanning lines or signal lines exist in lower regions, the coupling between the pixel electrodes and those scanning lines or signal lines can be inhibited effectively. Therefore, the present invention can provide a liquid crystal display device that is superior in display performance.

Further, because the stack order of the pixel electrodes and that of the auxiliary capacitance electrodes are made opposite to each other, the influences on the pixel electrodes through coupling can be minimized. Therefore, the present invention can provide a liquid crystal display device that is superior in display performance.

Obviously, numerous modifications and variations of the present invention are possible in light of the above teachings. It is therefore to be understood that within the scope of the appended claims, the invention may be practiced otherwise than as specifically described herein.

What is new and desired to be secured by letters patent of the United States is:

1. A liquid crystal display comprising:
   a substrate;
   a first electrode for a pixel;
   a second electrode for said pixel;
   a third electrode for said pixel;
   a common electrode;
   a first liquid crystal layer formed between said first electrode and said second electrode;
   a second liquid crystal layer formed between said second electrode and said third electrode;
   a third liquid crystal layer formed between said third electrode and said common electrode; and
   a shield electrode for said pixel, said shield electrode being formed between said first electrode and said substrate,
   wherein electric potentials of said third electrode and said shield electrode are substantially equal.

2. A liquid crystal display according to claim 1, further comprising a connector configured to connect electrically said third electrode to said shield electrode.

3. A liquid crystal display according to claim 1, wherein a difference between electric potentials of said third electrode and said shield electrode is constant.

4. A liquid crystal display according to claim 1, further comprising an amplifier connected between said third electrode and said shield electrode.

5. A liquid crystal display according to claim 1, further comprising a capacitor connected between said third electrode and said shield electrode.

6. A liquid crystal display according to claim 1, wherein said shield electrode has substantially a same shape as said third electrode.

7. A liquid crystal display according to claim 1, wherein said shield electrode and said third electrode are configured to be operated dependently.

8. A liquid crystal display according to claim 1, further comprising:
   a first potential controller configured to control electric potentials of said first electrode and said second electrode; and
   a second potential controller configured to control electric potentials of said third electrode and said shield electrode.

9. A liquid crystal display according to claim 8, wherein:
   said first controller is configured to first apply predetermined signals to said first and said second liquid crystal layers and to then keep said first electrode and said second electrode floating; and
   said second controller is configured to apply electric potentials to said third electrode and said shield electrode.

10. A liquid crystal display according to claim 9, wherein said electric potentials of said third electrode and said shield electrode are substantially equal.

11. A liquid crystal display according to claim 9, wherein a difference between said electric potentials of said third electrode and said shield electrode is constant.

12. A liquid crystal display comprising:
   a substrate;
   a first electrode for a pixel;
   a second electrode for said pixel;
   a third electrode for said pixel;
   a common electrode;
   a first liquid crystal layer formed between said first electrode and said second electrode;
   a second liquid crystal layer formed between said second electrode and said third electrode;
   a third liquid crystal layer formed between said third electrode and said common electrode;
   a first capacitance electrode formed between said first electrode and said substrate, and electrically connected to said first electrode;
   a second capacitance electrode formed between said first capacitance electrode and said substrate, and electrically connected to said second electrode;
   a third capacitance electrode formed between said second capacitance electrode and said substrate, and electrically connected to said third electrode; and
   a common capacitance electrode formed between said third capacitance electrode and said substrate, and connected to a fixed electric potential;
   a first potential controller configured to control electric potentials of said first electrode and said second electrode; and
   a second potential controller configured to control electric potentials of said third electrode and said third capacitance,
   wherein:
      said first capacitance electrode and said second capacitance electrode form a first auxiliary capacitor,
      said second capacitance electrode and said third capacitance electrode form a second auxiliary capacitor, and said third capacitance electrode and said common capacitance electrode form a third auxiliary capacitor.

13. A liquid crystal display according to claim 12, wherein:

said first controller is configured to first apply predetermined electric potentials to said first and said second electrodes and to then keep said first electrode and said second electrode floating; and said second controller is configured to apply electric potentials to said third electrode and said third capacitance.

14. A liquid crystal display comprising:

a substrate;

a first electrode for a pixel;

a second electrode for said pixel;

a third electrode for said pixel;

a common electrode;

a first liquid crystal layer formed between said first electrode and said second electrode;

a second liquid crystal layer formed between said second electrode and said third electrode;

a third liquid crystal layer formed between said third electrode and said common electrode;

a first part electrode of a first capacitance for said pixel, electrically connected to said first electrode;

a second part electrode of said first capacitance for said pixel;

a first part electrode of a second capacitance for said pixel, electrically connected to said second electrode;

a second part electrode of said second capacitance for said pixel;

a first part electrode of a third capacitance for said pixel, electrically fixed an electrical potential;

a second part electrode of said third capacitance for said pixel, formed between said first electrode and said first part electrode of said third capacitance, wherein electrical potentials of said second part electrode of said first capacitance and said second part electrode of said second capacitance and said first part electrode of said third capacitance are substantially equal.

15. A liquid crystal display according to claim 14, wherein:

said second part electrode of said first capacitance is formed between said first electrode and said first part electrode of said first capacitance; and said second part electrode of said second capacitance is formed between said first electrode and said first part electrode of said second capacitance.

16. A liquid crystal display according to claim 14, wherein:

said first part electrode of said first capacitance is formed between said first electrode and said second part electrode of said first capacitance; and said first part electrode of said second capacitance is formed between said first electrode and said second part electrode of said second capacitance.

17. A liquid crystal display according to claim 14, further comprising:

connectors configured to connect said second part electrode of said first capacitance and said second part electrode of said second capacitance and said first part electrode of said third capacitance.

* * * * *